(12) United States Patent
Choi et al.

(10) Patent No.: US 12,374,642 B2
(45) Date of Patent: Jul. 29, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Moorym Choi, Yongin-si (KR); Junyoung Choi, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 470 days.

(21) Appl. No.: 17/977,689

(22) Filed: Oct. 31, 2022

(65) Prior Publication Data

US 2023/0138478 A1 May 4, 2023

(30) Foreign Application Priority Data

Nov. 2, 2021 (KR) .................. 10-2021-0148923

(51) Int. Cl.
*H01L 25/065* (2023.01)
*H01L 23/00* (2006.01)
(Continued)

(52) U.S. Cl.
CPC .............. *H01L 24/08* (2013.01); *H01L 24/80* (2013.01); *H01L 25/0657* (2013.01);
(Continued)

(58) Field of Classification Search
CPC ..... H01L 24/08; H01L 24/80; H01L 25/0657; H01L 25/18; H01L 25/50;
(Continued)

(56) References Cited

U.S. PATENT DOCUMENTS 10,354,987 B1   7/2019  Mushiga et al.
12,068,299 B2 * 8/2024  Sanuki ............... H01L 24/08
(Continued)

FOREIGN PATENT DOCUMENTS

| CN | 112074956 A | 12/2020 |
| CN | 112204742 A | 1/2021 |
| CN | 112272868 A | 1/2021 |
| CN | 112614849 A | 4/2021 |
| CN | 112885842 A | 6/2021 |
| CN | 112185977 B | 10/2021 |
| KR | 1020200052497 A | 5/2020 |

(Continued)

*Primary Examiner* — Thanh Y. Tran
(74) *Attorney, Agent, or Firm* — Muir Patent Law, PLLC

(57) ABSTRACT

A semiconductor device includes: a first substrate; circuit devices disposed on the first substrate; a lower interconnection structure electrically connected to the circuit devices; a lower bonding structure connected to the lower interconnection structure; an upper bonding structure bonded to the lower bonding structure; an upper interconnection structure connected to the upper bonding structure; a second substrate disposed on the upper interconnection structure; a conductive plate disposed below the second substrate; gate electrodes disposed between the upper interconnection structure and the conductive plate and stacked in a vertical direction; channel structures penetrating through the gate electrodes; a plurality of conductive patterns, respectively disposed in a plurality of openings penetrating through the second substrate; and a peripheral contact plug extending in the vertical direction in an external region from the conductive plate and being connected to one of the plurality of conductive patterns.

20 Claims, 24 Drawing Sheets

(51) Int. Cl.
  *H01L 25/00* (2006.01)
  *H01L 25/18* (2023.01)
(52) U.S. Cl.
  CPC .............. *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)
(58) Field of Classification Search
  CPC . H01L 2224/08145; H01L 2224/80895; H01L 2224/80896; H01L 2924/1431; H01L 2924/14511; H01L 24/82; H01L 2225/06506; H01L 2225/0651; H01L 2225/06541; H10B 43/40; H10B 43/27
  See application file for complete search history.

(56) References Cited

U.S. PATENT DOCUMENTS

| | | |
|---|---|---|
| 2014/0141610 A1 | 5/2014 | Jin et al. |
| 2020/0144242 A1 | 5/2020 | Park |
| 2020/0286842 A1 | 9/2020 | Sanuki |
| 2021/0111122 A1 | 4/2021 | Liu |
| 2021/0134819 A1 | 5/2021 | Zhang et al. |
| 2022/0181284 A1* | 6/2022 | Shin ................. H01L 25/50 |

FOREIGN PATENT DOCUMENTS

| | | |
|---|---|---|
| KR | 1020210025032 A | 3/2021 |
| WO | 2022021175 A1 | 2/2022 |
| WO | 2022021428 A1 | 2/2022 |

\* cited by examiner

SEMICONDUCTOR DEVICES AND DATA STORAGE SYSTEMS INCLUDING THE SAME

CROSS-REFERENCE TO RELATED APPLICATION(S)

This application claims the benefit of priority under 35 U.S.C. § 119 to Korean Patent Application No. 10-2021-0148923 filed on Nov. 2, 2021 in the Korean Intellectual Property Office, the disclosure of which is incorporated herein by reference in its entirety.

BACKGROUND

The present disclosure relates to semiconductor devices and data storage systems including the same.

In a data storage system requiring data storage, there is increasing demand for a semiconductor device, which may store high-capacity data. Accordingly, research into methods of increasing data storage capacity of a semiconductor device has been conducted. For example, a semiconductor device including three-dimensionally arranged memory cells, rather than two-dimensionally arranged memory cells, has been proposed as a way of increasing data storage capacity of a semiconductor device.

SUMMARY

Example embodiments provide a semiconductor device fabricated in a simple fabrication process and having improved electrical characteristics and reliability.

Example embodiments provide a data storage system including a semiconductor device fabricated in a simple fabrication process and having improved electrical characteristics and reliability.

According to an example embodiment, a semiconductor device includes: a first semiconductor structure including a first substrate, circuit devices disposed on the first circuit, a lower interconnection structure electrically connected to the circuit devices, and a lower bonding structure connected to the lower interconnection structure; and a second semiconductor structure including a second substrate disposed on the first semiconductor structure and having a plurality of openings, a plurality of conductive patterns, respectively disposed in the plurality of openings, a buffer insulating layer disposed on side surfaces of the plurality of conductive patterns in the plurality of openings, a conductive plate disposed below the second substrate, gate electrodes spaced apart from each other and stacked in a vertical direction, perpendicular to a lower surface of the conductive plate, channel structures penetrating through the gate electrodes, extending in the vertical direction, and each including a channel layer, a plurality of peripheral contact plugs extending in the vertical direction in an external region from the conductive plate, an upper interconnection structure disposed below the gate electrodes and the channel structures, and an upper bonding structure connected to the upper interconnection structure and bonded to the lower bonding structure. Each of the plurality of conductive patterns has a shape in which a width decreases from a lower surface of the second substrate to an upper surface of the second substrate. The plurality of conductive patterns include a plurality of first conductive patterns, overlapping the conductive plate in the vertical direction, and a plurality of second conductive patterns spaced apart from and not overlapping the conductive plate in the vertical direction. The plurality of peripheral contact plugs are connected to the plurality of second conductive patterns, respectively.

According to an example embodiment, a semiconductor device includes: a first substrate; circuit devices disposed on the first substrate; a lower interconnection structure electrically connected to the circuit devices; a lower bonding structure connected to the lower interconnection structure; an upper bonding structure bonded to the lower bonding structure; an upper interconnection structure connected to the upper bonding structure; a second substrate disposed on the upper interconnection structure; a conductive plate disposed below the second substrate; gate electrodes disposed between the upper interconnection structure and the conductive plate and stacked to be spaced apart from each other in a vertical direction; channel structures penetrating through the gate electrodes and each channel structure including a channel layer; a plurality of conductive patterns, respectively disposed in a plurality of openings penetrating through the second substrate; and a peripheral contact plug extending in the vertical direction in an external region from the conductive plate and being connected to one of the plurality of conductive patterns. A width, in a horizontal direction, of a lower portion of the conductive pattern in contact with the peripheral contact plug is greater than a width, in the horizontal direction, of an upper portion of the conductive pattern.

According to an example embodiment, a data storage system includes: a semiconductor storage device including a first semiconductor structure including a first substrate and circuit devices on the first substrate, a second semiconductor structure including a second substrate having a plurality of openings, gate electrodes stacked below the second substrate to be spaced apart from each other, and channel structures penetrating through the gate electrodes, and input/output pads electrically connected to the circuit devices; and a controller electrically connected to the semiconductor storage device through the input/output pad and configured to control the semiconductor storage device. The first semiconductor structure includes: a lower interconnection structure electrically connected to the circuit devices; and a lower bonding structure connected to the lower interconnection structure. The second semiconductor structure includes: an upper bonding structure bonded to the lower bonding structure; an upper interconnection structure connected to the upper bonding structure; a conductive plate between the second substrate and the gate electrodes; a plurality of conductive patterns, respectively disposed in the plurality of openings of the second substrate; a buffer insulating layer disposed on side surfaces of the plurality of conductive patterns in the plurality of openings; and a plurality of peripheral contact plugs extending in a vertical direction in an external region from the conductive plate. The plurality of peripheral contact plugs are connected to a portion of the plurality of conductive patterns, respectively. The plurality of conductive patterns are arranged to be spaced apart from each other throughout an entire region of the second substrate. Each of the plurality of conductive patterns has a structure in which a width of a lower portion in a horizontal direction is greater than a width of an upper portion in the horizontal direction.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings. In the descriptions below, spatially relative terms, such as "above," "upper," "upper portion," "upper surface," "beneath," "below," "lower," "lower portion," "lower surface," "side surface," and the like, are used with reference to the diagrams unless otherwise indicated. It will be understood that the spatially relative terms are intended to encompass different orientations of the device in use or operation in addition to the orientation depicted in the figures.

Figure 1:
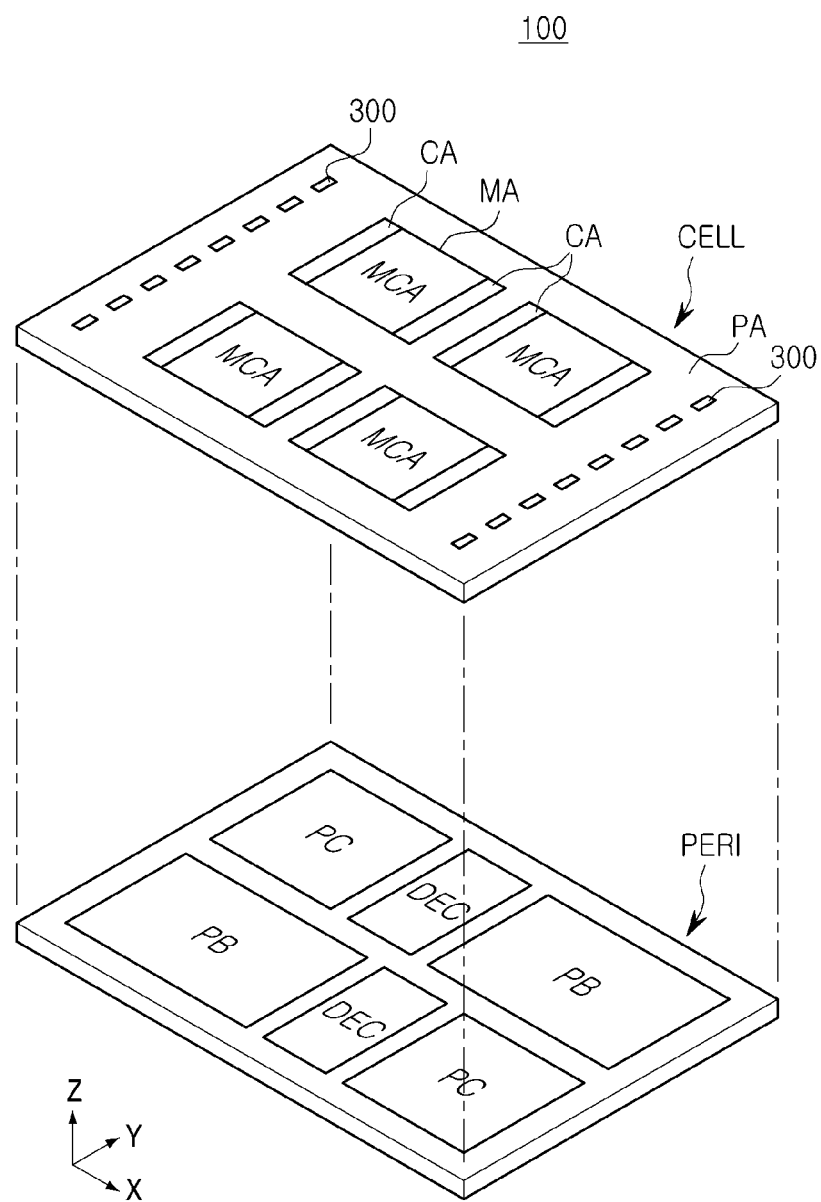
FIG. 1 is a schematic exploded perspective view of a semiconductor device according to example embodiments.

FIG. 1 is a schematic exploded perspective view of a semiconductor device according to example embodiments.

Referring to FIG. 1, a semiconductor device 100 according to example embodiments may include a peripheral circuit region PERI and a memory cell region CELL stacked in a vertical direction Z. The peripheral circuit region PERI and the memory cell region CELL may be bonded and coupled to each other. The memory cell region CELL may include a memory region MA, including a memory cell array region MCA and a connection region CA, and an external region PA disposed on an external side of the memory region MA. A conductive pad 300, an input/output pad, may be disposed on the external region PA. The memory region MA, including a memory cell array region MCA and a connection region CA, may be provided as a plurality of memory regions MA.

The peripheral circuit region PERI may include a row decoder DEC, a page buffer PB, and other peripheral circuits PC. In the peripheral circuit region PERI, the row decoder DEC may decode an input address to generate and transmit driving signals through wordlines. The page buffer PB may be connected to the memory cell array region MCA through bitlines to read information stored in memory cells. The peripheral circuit PC may be a region including a control logic and a voltage generator, and may include, for example, a latch circuit, a cache circuit, and/or a sense amplifier. The peripheral circuit region PERI may further include an additional pad region. In this case, the pad region may include an electrostatic discharge (ESD) device or a data input/output circuit. The ESD device or the data input/output circuit of the pad region may be electrically connected to the conductive pad 300 of the external region PA. The various circuit regions DEC, PB, and PC in the peripheral circuit region PERI may be arranged to have various shapes.

Figure 2:
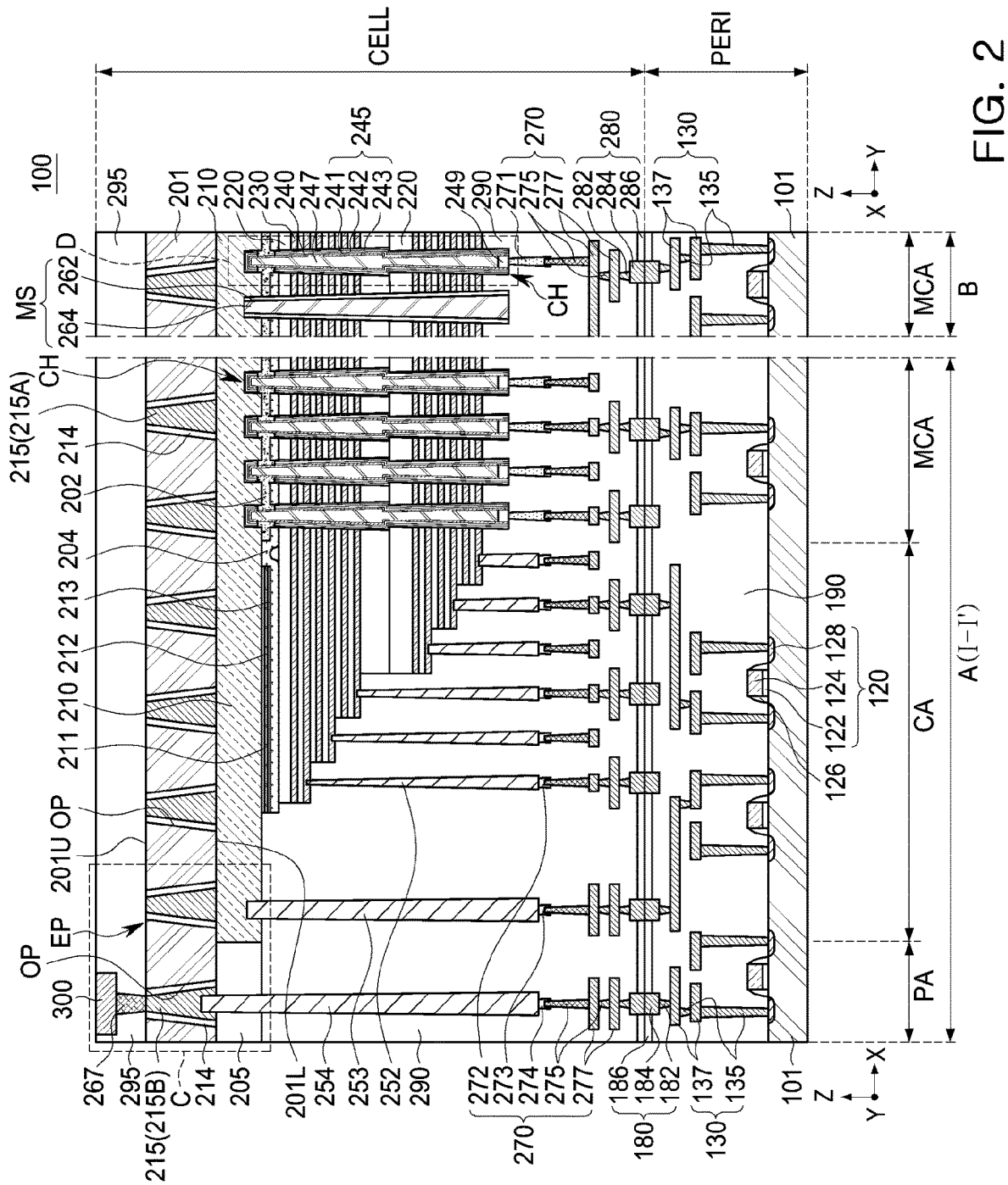
FIG. 2 is a schematic cross-sectional view of a semiconductor device according to example embodiments.

Hereinafter, an example of the semiconductor device 100 will be described with reference to FIGS. 2 to 4B. In FIG. 2, a region "A" may be a schematic cross-section, illustrating a portion of the memory cell array region MCA, the connection region CA, and a portion of the external region PA illustrated in FIG. 1, taken in an X-direction, and a region "B" is a schematic cross-section, illustrating a portion of the memory cell array MCA illustrated in FIG. 1, taken in a Y direction.

FIG. 2 is a schematic cross-sectional view of a semiconductor device according to example embodiments. The region "A" of FIG. 2 may correspond to a cross-section of the semiconductor device 100 taken along line I-I of FIG. 3.

Figure 3:
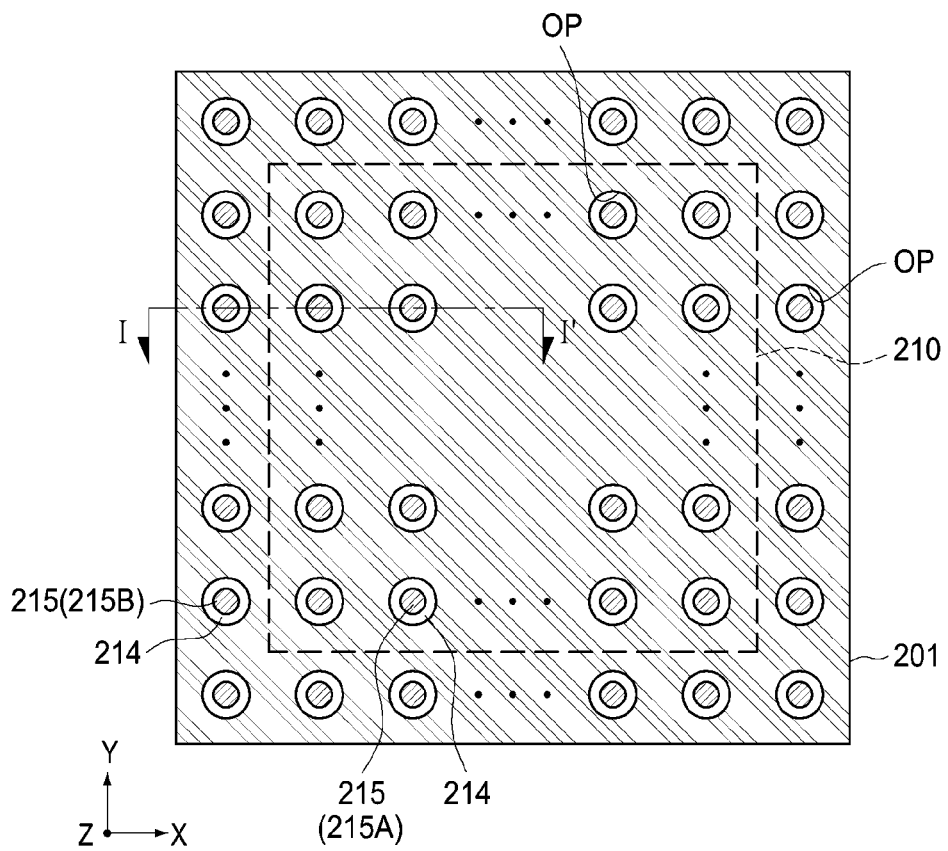
FIG. 3 is a plan view illustrating some components of a semiconductor device according to example embodiments.

FIG. 3 is a plan view illustrating some components of a semiconductor device according to example embodiments. FIG. 3 illustrates an example of shapes and an arrangement relationship of the second substrate 201, in which a plurality of conductive patterns 215 are disposed in an opening OP, and the conductive plate 210 including a common source line.

Referring to FIGS. 2 and 3, the semiconductor device 100 may include a peripheral circuit region PERI and a memory cell region CELL. The memory cell region CELL may be disposed on the peripheral circuit region PERI. The peripheral circuit region PERI and the memory cell region CELL may be bonded to each other through bonding structures 180 and 280. The peripheral circuit region PERI may be referred to as a first semiconductor structure, and the memory cell region CELL may be referred to as a second semiconductor structure.

The peripheral circuit region PERI may include a first substrate 101, circuit devices 120 on the first substrate 101, a lower interconnection structure 130, a lower bonding structure 180, and a lower capping layer 190.

The first substrate 101 may include a semiconductor material, for example, a group IV semiconductor, a group III-V compound semiconductor, or a group II-VI compound semiconductor. The first substrate 101 may be provided as a bulk wafer or an epitaxial layer. An active region may be defined in the first substrate 101 by device isolation layers. Source/drain regions 128 including impurities may be disposed in a portion of the active region.

The circuit devices 120 may include transistors. Each of the circuit devices 120 may include a circuit gate dielectric layer 122, a circuit gate electrode 124, and a source/drain region 128. Source/drain regions 128 including impurities may be disposed in the first substrate 101 on opposite sides adjacent to the circuit gate electrode 124. The spacer layers 126 may be disposed on opposite sides of the circuit gate electrode 124. The circuit gate dielectric layer 122 may include or may be formed of a silicon oxide, a silicon nitride, or a high-k dielectric material. The circuit gate electrode 124 may include or may be formed of at least one of titanium nitride (TiN), tantalum nitride (TaN), and tungsten nitride (WN), titanium silicon nitride (TiSiN), tantalum silicon nitride (TaSiN), and tungsten silicon nitride (WSiN), tungsten (W), copper (Cu), aluminum (Al), molybdenum (Mo), and ruthenium (Ru). The circuit gate electrode 124 may include a semiconductor layer, for example, a doped polysilicon layer. In an exemplary embodiment, the circuit gate electrode 124 may have a multilayer structure including two or more layers.

The lower interconnection structure 130 may be electrically connected to the circuit gate electrodes 124 and the source/drain regions 128 of the circuit devices 120. The lower interconnection structure 130 may include lower contact plugs 135, having a cylindrical or truncated cone shape, and lower interconnection lines 137 having at least one line-shaped region. A portion of the lower contact plugs 135 may be connected to the source/drain regions 128. Although not illustrated in the drawings, other lower contact plugs 135 may be connected to the gate electrodes 124. The lower contact plugs 135 may electrically connect the lower interconnection lines 137, disposed at different levels from an upper surface of the first substrate 101 along the Z-direction, to each other. The lower interconnection structure 130 may include or may be formed of a conductive material, for example, tungsten (W), copper (Cu), aluminum (Al), or the like. Each of the components may further include a diffusion barrier including at least one of titanium (Ti), titanium nitride (TiN), tantalum (Ta), tantalum nitride (TaN), and tungsten nitride (WN). The number and arrangement of the lower contact plugs 135 and lower interconnection lines 137, constituting the lower interconnection structure 130, may vary according to example embodiments.

The lower bonding structure 180 may be connected to the lower interconnection structure 130. The lower bonding structure 180 may include a lower bonding via 182, a lower bonding pad 184, and a lower bonding insulating layer 186. The lower bonding via 182 may be connected to the lower interconnection structure 130. The lower bonding pad 184 may be connected to the lower bonding via 182. The lower bonding via 182 and the lower bonding pad 184 may include or may be formed of a conductive material, for example, tungsten (W), copper (Cu), aluminum (Al), or the like. Each of the components may further include a diffusion barrier. The lower bonding insulating layer 186 may also serve as a diffusion barrier of the lower bonding pad 184, and may include or may be formed of at least one of SiCN, SiO, SiN, SiOC, SiON, and SiOCN. The lower bonding insulating layer 186 may have a thickness less than that of the lower bonding pad 184, but example embodiments are not limited thereto. The lower bonding structure 180 may be brought into contact with the upper bonding structure 280 and may be bonded or connected to the upper bonding structure 280 by hybrid bonding that uses, for example, copper-to-copper (Cu-to-Cu) bonding and dielectric-to-dielectric bonding. For example, the lower bonding pad 184 and the upper bonding pad 284 may be brought into contact with each other and coupled to each other by Cu-to-Cu bonding, and the lower bonding insulating layer 186 and the upper bonding insulating layer 286 may be brought into contact with each other and coupled to each other by dielectric-to-dielectric bonding. The lower bonding structure 180 may provide an electrical connection path between the peripheral circuit region PERI and the memory cell region CELL together with the upper bonding structure 280. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The lower capping layer 190 may be disposed on the first substrate 101 to cover the circuit devices 120 and the lower interconnection structure 130. The lower capping layer 190 may include a plurality of insulating layers. The lower capping layer 190 may include or may be formed of an insulating material, for example, a silicon oxide, a silicon nitride, a silicon oxynitride, or a silicon oxycarbide.

The memory cell region CELL may include a second substrate 201 having a plurality of openings OP, a plurality of buffer insulating layers 214 disposed in the plurality of openings OP, a plurality of conductive patterns 215, a conductive plate 210 below the second substrate 201, first and second horizontal conductive layers 202 and 204 below the conductive plate 210, gate electrodes 230 stacked below the conductive plate 210, separation region MS extending while penetrating through a stack structure of the gate electrodes 230, channel structures CH disposed to penetrate through the stack structure, contact plugs 252, 253, and 254 for electrical connection to the peripheral circuit region PERI, an upper interconnection structure 270 below the stack structure, and an upper bonding structure 280 connected to the upper interconnection structure 270. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The memory cell region CELL may include an external insulating layer 205 in contact with an external end portion of the conductive plate 210, and first to third horizontal sacrificial layers 211, 212, 213 between the conductive plate 210 and the second horizontal conductive layer 204, interlayer insulating layers 220 stacked alternately with the gate electrodes 230 below the conductive plate 210, a peripheral contact pad 265 and a peripheral contact via 267 disposed on the peripheral contact plug 254, upper capping layer 290 covering the stack structure, upper insulating layer 295 disposed on the conductive plate 210, and a conductive pad 300 disposed on the peripheral contact via 267.

In the memory cell region CELL, the memory cell array region MCA, the connection region CA, and the external region PA may be defined based on, for example, the conductive plate 210 and peripheral components of the conductive plate 210.

As illustrated in FIG. 2, the memory cell array region MCA may be a region in which the channel structures CH are disposed and the gate electrodes 230 are stacked and spaced apart from each other in a vertical direction, for example, a Z-direction. As illustrated in FIG. 2, the connection region CA is a region in which the gate electrodes 230 extend by different lengths to provide contact pads for electrically connecting memory cells to the peripheral circuit region PERI. The memory cell array region MCA and the connection region CA may be understood as regions including the conductive plate 210 and including both an underlying region and an overlying region of the conductive plate 210.

As illustrated in FIG. 2, the external region PA may refer to a region from an external end of the conductive plate 210 to an edge of the semiconductor device 100, and may be a region in which the conductive pad 300 and the peripheral contact plug 254 are disposed. The external region PA may be a region, other than a region in which the memory cell array region MCA and the connection region CA are disposed, in the memory cell region CELL. The external region PA may refer to a region in which the external insulating layer 205 disposed on an external side of the conductive plate 210 is disposed, or a region including the external insulating layer 205 and including both an underlying region and an overlying region of the external insulating layer 205.

The second substrate 201 may include or may be formed of a semiconductor material, for example, a group IV semiconductor, a group III-V compound semiconductor, or a group II-VI compound semiconductor. For example, the group IV semiconductor may include or may be formed of silicon (Si), germanium (Ge), or silicon-germanium (SiGe). A lower surface 201L of the second substrate 201 may be in contact with the conductive plate 210. An upper surface 201U of the second substrate 201 may be disposed to be farther from the conductive plate 210 than the lower surface 201L in the Z-direction. The second substrate 201 may have a plurality of openings OP spaced apart from each other throughout the entire region of the second substrate 201, as illustrated in FIG. 3. The plurality of openings OP may have a shape of which a width is decreased in a direction toward the upper surface 201U of the second substrate 201 from the lower surface 201L. A plurality of conductive patterns 215 may be disposed in the plurality of openings OP, respectively. A buffer insulating layer 214 may be disposed on side surfaces of the plurality of conductive patterns 215 in the plurality of openings OP.

A plurality of buffer insulating layers 214 may be disposed between the plurality of conductive patterns 215 and the second substrate 201. The plurality of buffer insulating layers 214 may electrically separate the plurality of conductive patterns 215 from the second substrate 201. The buffer insulating layer 214 may surround a side surface of the conductive pattern 215. The plurality of buffer insulating layers 214 may include or may be formed of an insulating material, for example, at least one of a silicon oxide, a silicon nitride, a silicon oxynitride, and a silicon oxycarbide. The buffer insulating layer 214 may include a plurality of insulating layers or a single insulating layer.

The plurality of conductive patterns 215 may be arranged to be spaced apart from each other throughout the entire region of the second substrate 201. The plurality of conductive patterns 215 may have a cross-sectional shape of which a width is decreased in a direction toward the upper surface 201U of the second substrate 201 from the lower surface 201L of the second substrate 201. For example, in each of the plurality of conductive patterns 215, a width of a lower portion may be greater than a width of an upper portion. In the conductive pattern 215, the lower portion may be disposed to be closer to the conductive plate 210 in the Z-direction than the upper portion. For example, in the second conductive pattern 215, a width W1 of a lower portion may be greater than a width W2 of an upper portion.

The plurality of conductive patterns 215 may include a plurality of first conductive patterns 215A in contact with the conductive plate 210 and a plurality of second conductive patterns 215B spaced apart from (e.g., not in contact with or overlapping in the Z-direction) the conductive plate 210. The plurality of first conductive patterns 215A may overlap the conductive plate 210 in a Z-direction, and at least a portion of the plurality of first conductive patterns 215A may overlap the gate electrodes 230 in the Z-direction. The plurality of second conductive patterns 215B may be disposed in a region in which the second substrate 201 does not overlap the conductive plate 210 in the Z-direction, for example, in the external region PA. The plurality of second conductive patterns 215B may be disposed in the external region PA and may be connected to the peripheral contact plug 254 and the peripheral contact via 267. The plurality of second conductive patterns 215B may be pads on which the peripheral contact plugs 254 are disposed. A lower end of the first conductive pattern 215A may be disposed at substantially the same level as a lower end of the second conductive pattern 215B in the Z-direction. Each of the plurality of conductive patterns 215 may include a barrier layer 215a and a conductive layer 215b, which will be further described with reference to FIG. 4A below.

According to example embodiments, the semiconductor device 100 includes the second substrate 201 in contact with the conductive plate 210, and thus, may serve to ground the conductive plate 210 and the second horizontal conductive layer 204 to prevent arcing from occurring during a process of fabricating the semiconductor device 100 without an additional component such as a bypass via. Accordingly, electrical characteristics and reliability of the semiconductor device 100 may be improved. In addition, the plurality of conductive patterns 215 disposed in the plurality of openings OP of the second substrate 201 may serve as a stopper when a planarization process is performed on a backside of the second substrate 201, so that a thickness of the second substrate 201 may be controlled to improve reliability of the semiconductor device. In addition, since the plurality of conductive patterns 215 may serve as an align key in a photolithography process for forming components constituting the memory cell region on the second substrate 201, a process of forming an align key may be omitted to simplify the process of fabricating the semiconductor device.

For example, the second substrate 201 may serve as a bypass via to prevent arcing from occurring, the plurality of conductive patterns 215 disposed in the second substrate 201 may serve as a stopper and an align key, and a portion of the patterns 215B may serve as a landing pad to which the peripheral contact plug 254 is connected in the external region PA. Accordingly, electrical characteristics and reliability of the semiconductor device 100 may be improved while significantly simplifying a structure and fabrication process of the semiconductor device.

The conductive plate 210 may be disposed below the second substrate 201. The conductive plate 210 may be formed of, for example, N-type polysilicon. The conductive plate 210 formed of N-type polysilicon may include a common source region.

The first and second horizontal conductive layers 202 and 204 may be stacked and disposed on a lower surface of the conductive plate 210 in the memory cell array region MCA. The first horizontal conductive layer 202 may serve as a portion of the common source region of the semiconductor device 100, for example, as a common source region together with the conductive plate 210. The first horizontal conductive layer 202 may penetrate through the gate dielectric layer 245 to be in contact with the channel layer 240. The first horizontal conductive layer 202 may be disposed in the memory cell array region MCA and may not extend to the connection region CA. The second horizontal conductive layer 204 may be disposed in the connection region CA and the memory cell array region MCA. The second horizontal conductive layer 204 may include a portion bent to be in contact with an end portion of the first horizontal conductive layer 202, and the portion may extend to be in contact with the conductive plate 210.

The first and second horizontal conductive layers 202, 204 may include a semiconductor material, for example, polysilicon. In this case, at least the first horizontal conductive layer 202 may be a layer doped with impurities of the same conductivity type as the conductive plate 210, and the second horizontal conductive layer 204 may be a doped layer or a layer including impurities diffused from the first horizontal conductive layer 202. However, the material of the second horizontal conductive layer 204 is not limited to the semiconductor material, and may be replaced with an insulating material.

The first to third horizontal sacrificial layers 211, 212, and 213 may be disposed, side by side, below the conductive plate 210 and above the first horizontal conductive layer 202 in a portion of the connection region CA. The first to third horizontal sacrificial layers 211, 212, and 213 may be sequentially stacked below the conductive plate 210. The first to third horizontal sacrificial layers 211, 212, and 213 may be layers remaining after a portion of the first to third horizontal sacrificial layers 211, 212, and 213 is replaced with the first horizontal conductive layer 202 in the process of fabricating the semiconductor device 100. However, an arrangement of regions, in which the first to third horizontal sacrificial layers 211, 212, and 213 remain in the connection region CA, may vary according to example embodiments.

The first and third horizontal sacrificial layers 211 and 213 and the second horizontal sacrificial layer 212 may include different insulating materials. The first and third horizontal sacrificial layers 211 and 213 may include the same material. For example, the first and third horizontal sacrificial layers 211 and 213 may be formed of the same material as the interlayer insulating layers 220, and the second horizontal sacrificial layer 212 may be formed of the same material as the sacrificial insulating layers 218 discussed below with respect to FIG. 10. For example, the first and third horizontal sacrificial layers 211 and 213 may include a silicon oxide, and the second horizontal sacrificial layer 212 may include a silicon nitride.

The external insulating layer 205 may be disposed in a region, in which a portion of the conductive plate 210 is removed, to be in contact with an external end portion of the conductive plate 210. A lower surface of the external insulating layer 205 may be substantially coplanar with a lower surface of the conductive plate 210, but example embodiments are not limited thereto. The external insulating layer 205 may be formed of an insulating material and may include or may be formed of, for example, a silicon oxide, a silicon oxynitride, or a silicon nitride. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The gate electrodes 230 may be vertically spaced apart from each other and stacked below the conductive plate 210 to form a stack structure. The gate electrodes 230 may be disposed between the conductive plate 210 and the upper interconnection structure 270 in the Z-direction. The gate electrodes 230 may include electrodes forming a ground select transistor, memory cells, and a string select transistor in sequential order in the Z-direction from the conductive plate 210. The number of the gate electrodes 230 constituting the memory cells may be determined depending on storage capacity of the semiconductor device 100. According to example embodiments, the number of the gate electrodes 230 constituting the string select transistor and the number of the gate electrodes 230 constituting the ground select transistor may each be one or more, and the gate electrodes 230 constituting the string select transistor and the gate electrodes 230 constituting the ground select transistor may have a structure the same as or different from that of the gate electrodes 230 of the memory cells. In addition, the gate electrodes 230 may further include a gate electrode 230 constituting an erase transistor used for an erase operation using gate induced drain leakage (GIDL). The gate electrode 230 constituting the erase transistor may be disposed below the gate electrode 230 constituting the string select transistor and above the gate electrode 230 constituting the ground select transistor.

The gate electrodes 230 may be stacked to be spaced apart from each other in the vertical direction (Z-direction) in the memory cell array region MCA, and may extend from the memory cell array region MCA to the connection region CA by different lengths to have a step structure having a staircase shape. As illustrated in FIG. 2, the gate electrodes 230 may be disposed to have a step structure in an X-direction and may also be disposed to have a step structure in a Y-direction. Due to the step structure, the gate electrodes 230 may have a step shape in which an overlying gate electrode 230 extends further than an underlying gate electrode 230 and faces the first substrate 101 from the interlayer insulating layers 220 and may provide end portions exposed toward the first substrate 101 from the interlayer insulating layer 220. In example embodiments, the gate electrodes 230 may have an increased thickness on the end portions. Although not illustrated, some electrodes constituting the string select transistor, among the gate electrodes 230, may be separated by a separation insulating layer extending in the X-direction.

The gate electrodes 230 may constitute a lower gate stack group and an upper gate stack group disposed on the lower gate stack group. The interlayer insulating layer 220 disposed between the lower gate stack group and the upper gate stack group may have a relatively low thickness, but example embodiments are not limited thereto. In FIG. 2, two stack groups of the gate electrodes 230 are illustrated as being vertically disposed, but example embodiments are not limited thereto. The gate electrodes 230 may constitute a single stack group or a plurality of stack groups.

The gate electrodes 230 may include or may be formed of a metal material, for example, tungsten (W). According to embodiments, the gate electrodes 230 may include or may be formed of polysilicon or a metal silicide material. In example embodiments, the gate electrodes 230 may further include a diffusion barrier layer. For example, the diffusion barrier layer may include or may be formed of tungsten nitride (WN), tantalum nitride (TaN), titanium nitride (TiN), or combinations thereof.

The interlayer insulating layers 220 may be disposed between the gate electrodes 230. Similarly to the gate electrodes 230, the interlayer insulating layers 220 may be spaced apart from each other in the Z-direction, perpendicular to the lower surface of the conductive plate 210 and may be disposed to extend in the X-direction. The interlayer insulating layers 220 may include or may be formed of an insulating material such as a silicon oxide or a silicon nitride.

A separation region MS may be disposed to extend in the X-direction through the gate electrodes 230 in the memory cell array region MCA and the connection region CA. The separation region MS may penetrate through the entire gate electrodes 230, stacked below the conductive plate 210, and may be connected to the conductive plate 210. The separation region MS may have a shape in which a width is decreased in a direction (e.g., Z-direction) toward the conductive plate 210 due to a high aspect ratio. The separation region MS may extend in the X-direction to separate the gate electrodes 230 from each other in the Y-direction. The separation region MS may include a conductive layer 264 and a separation spacer 262. The separation spacer 262 may cover a side surface of the conductive layer 264. In an example embodiment, the separation region MS may be formed of an insulating material such as a silicon oxide or a silicon nitride.

The channel structures CH may each constitute a single memory cell string and may be spaced apart from each other in rows and columns on the memory cell array region MCA. In an X-Y plane, the channel structures CH may be disposed to form a grid pattern or may be disposed in a zigzag pattern in one direction. The channel structures CH may have a columnar shape, and may have inclined sides having widths decreased in a direction toward the conductive plate 210 depending on an aspect ratio. Each of the channel structures CH may have a form in which the lower and upper channel structures, respectively penetrating through the lower gate stack group and the upper gate stack group of the gate electrodes 230, are connected to each other, and may have a bent portion formed by a difference or change in width. A detailed configuration of the channel structures CH will be further described with reference to FIGS. 6A and 6B.

Figure 4A:
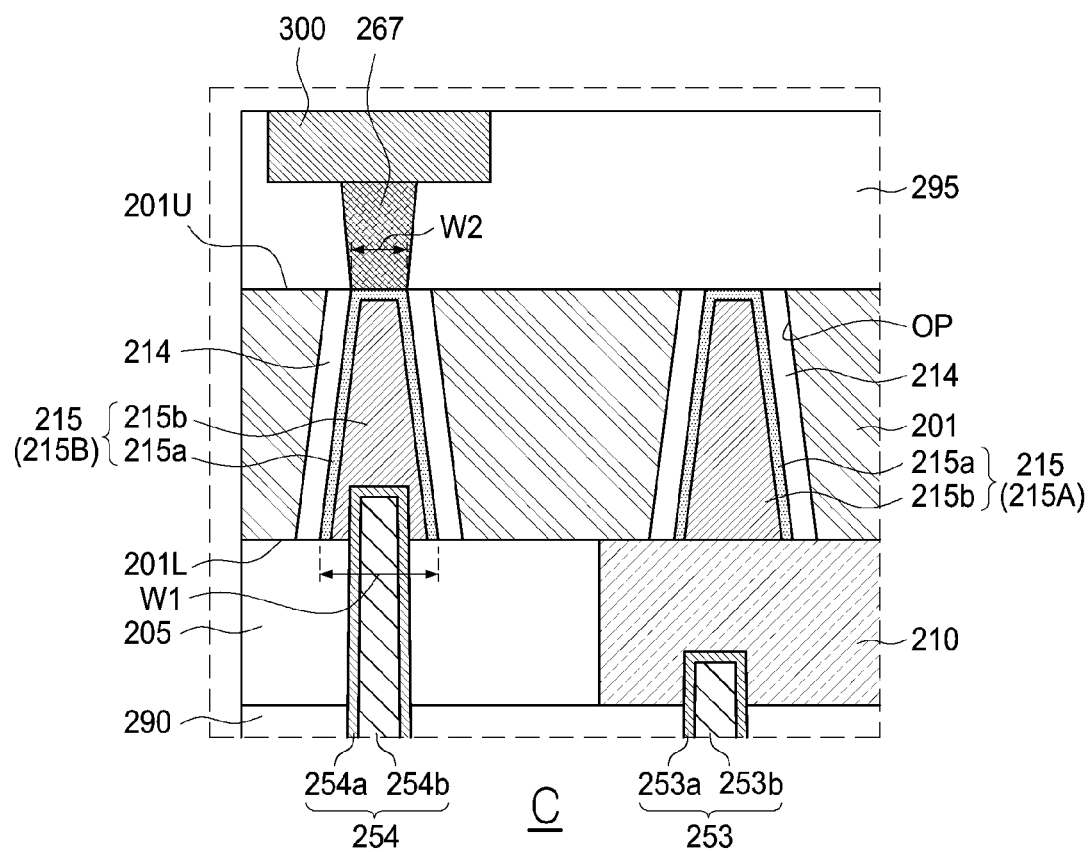
FIGS. 4A to 4C are partially enlarged cross-sectional views of a semiconductor device according to example embodiments.

Each of the contact plugs 252, 253, and 254 may have a cylindrical or truncated cone shape, and may have a width decreased in an upward direction depending on an aspect ratio. The contact plugs 252, 253, and 254 may penetrate through a portion of the upper capping layer 290. The contact plugs 252, 253, and 254 may include a gate contact plug 252, a source contact plug 253, and a peripheral contact plug 254. Each of the gate contact plug 252, the source contact plug 253, and the peripheral contact plug 254 may be provided as a plurality of plugs spaced apart from each other. Each of the contact plugs 252, 253, and 254 may include a conductive layer and a barrier layer surrounding side surfaces and one end of the conductive layer. For example, as illustrated in FIG. 4A, the source contact plug 253 may include a conductive layer 253*b* and a barrier layer 253*a*, the peripheral contact plug 254 may include a conductive layer 254*b* and a barrier layer 254*a*, and the barrier layers 253*a* and 254*a* may surround upper surfaces and side surfaces of the conductive layers 253*b* and 254*b*, respectively. The conductive layers 253*b* and 254*b* may include or may be formed of a conductive material, for example, a metal material such as tungsten (W), copper (Cu), or aluminum (Al), and the barrier layers 253*a* and 254*a* may include at least one of, for example, titanium (Ti), titanium nitride (TiN), tantalum (Ta), tantalum nitride (TaN), tungsten nitride (WN), and tungsten carbon nitride (WCN).

The gate contact plugs 252 may be disposed in the connection region CA to extend in a vertical direction, for example, the Z-direction. The gate contact plugs 252 may be connected to end portions of the gate electrodes 230, formed by a staircase shape, or contact pads, respectively. The gate contact plugs 252 may be connected to an upper interconnection structure 270 in a lower portion thereof.

The source contact plug 253 may extend in a vertical direction, for example, the Z-direction. A portion of the source contact plug 253 (e.g., "upper surface of the source contact plug 253") may be disposed within a recess of the conductive plate 210 such that the source contact plug 253 may be connected to and in contact with the conductive plate 210. Based on the upper surface of the first substrate 101, a lower surface of the source contact plug 253 may be disposed at a level lower than a level of a lowest gate electrode 230, among the gate electrodes 230. The lower surface of the source contact plug 253 may be connected to the upper interconnection structure 270. A width of an upper surface of the source contact plug 253 may be narrower than a width of the lower surface of the source contact plug 253. The source contact plug 253 may be formed in the same operation as the peripheral contact plug 254, and may have a shape the same as or similar to a shape of the peripheral contact plug 254.

The peripheral contact plug 254 may be spaced apart from the conductive plate 210 and the source contact plug 253 on an external side of the conductive plate 210, and may extend in a vertical direction, for example, the Z-direction. The peripheral contact plug 254 may penetrate through the upper capping layer 290 and the external insulating layer 205 to be connected to the second conductive pattern 215B. An upper surface of the peripheral contact plug 254 may be in contact with the second conductive pattern 215B. The peripheral contact plug 254 may be connected to and in contact with the second conductive pattern 215B through a recess formed in a lower portion of the second conductive pattern 215B. The peripheral contact plug 254 may be connected to the upper interconnection structure 270.

The lower region of the peripheral contact via 267 may have a width narrower than a width of the upper region of the peripheral contact via 267. In an exemplary embodiment, the peripheral contact via 267 may include or may be formed of aluminum (Al). The peripheral contact via 267 may be connected to the conductive pad 300. The peripheral contact via 267 may include a plurality of vias connected to the conductive pad 300.

The upper interconnection structure 270 may electrically connect the gate electrodes 230, the channel structures CH, the conductive plate 210, and the conductive pad 300 to the circuit devices 120. The upper interconnection structure 270 may include a channel contact plug 271, a gate contact stud 272, a source contact stud 273, a peripheral contact stud 274, an upper contact plug 275, and an upper interconnection line 277. The channel contact plug 271 may be connected to a channel pad 249 of the channel structure CH. The channel contact plug 271 may be electrically connected to the channel layer 240 through the channel pads 249 of the channel structures CH in the memory cell array region MCA. The gate contact stud 272 may be connected to the gate contact plug 252. The source contact stud 273 may be connected to the source contact plug 253. The peripheral contact stud 274 may be connected to the peripheral contact plug 254. The upper contact plugs 275 may be connected to the channel contact plug 271, the gate contact stud 272, the source contact stud 273, and the peripheral contact stud 274, respectively. The upper interconnection line 277 may be connected to the upper contact plug 275. The upper interconnection structure 270 may include or may be formed of a conductive material, for example, tungsten (W), copper (Cu), aluminum (Al), and the like, and may further include a diffusion barrier including at least one of titanium (Ti), titanium nitride (TiN), tantalum (Ta), tantalum nitride (TaN), and tungsten nitride (WN). The number and arrangement of the upper contact plugs 275 and the upper interconnection lines 277, constituting the upper interconnection structure 270, may vary according to example embodiments.

The upper bonding structure 280 may be connected to the upper interconnection structure 270. The upper bonding structure 280 may include an upper bonding via 282, an upper bonding pad 284, and an upper bonding insulating layer 286. The upper bonding via 282 may be connected to the upper interconnection structure 270. The upper bonding pad 284 may be connected to the upper bonding via 282. The upper bonding via 282 and the upper bonding pad 284 may include or may be formed of a conductive material, for example, tungsten (W), copper (Cu), aluminum (Al), or the like. Each of the components may further include a diffusion barrier. The upper bonding insulating layer 286 may also serve as a diffusion barrier layer of the upper bonding pad 284, and may include or may be formed of at least one of SiCN, SiO, SiN, SiOC, SiON, and SiOCN. The upper bonding insulating layer 286 may have a thickness less than that of the upper bonding pad 284, but example embodiments are not limited thereto.

The upper capping layer 290 may be disposed below the conductive plate 210 to cover the conductive plate 210, the external insulating layer 205, and the gate electrodes 230. The upper capping layer 290 may include a plurality of insulating layers. The upper capping layer 290 may include or may be formed of an insulating material, for example, a silicon oxide, a silicon nitride, a silicon oxynitride, or a silicon oxycarbide.

The upper insulating layer 295 may be disposed on the second substrate 201. The upper insulating layer 295 may cover the second substrate 201. The upper insulating layer 295 may include or may be formed of an insulating material, for example, a silicon oxide, a silicon nitride, a silicon oxynitride, or a silicon oxycarbide.

The conductive pad 300 is an input/output pad of the semiconductor device 100 and may be electrically connected to a controller. The conductive pad 300 may be in contact with the peripheral contact via 267. The conductive pad 300 may be electrically connected to the circuit devices 120 in the peripheral circuit region PERI. In an example embodiment, the conductive pad 300 may include or may be formed of aluminum (Al).

Figure 4B:
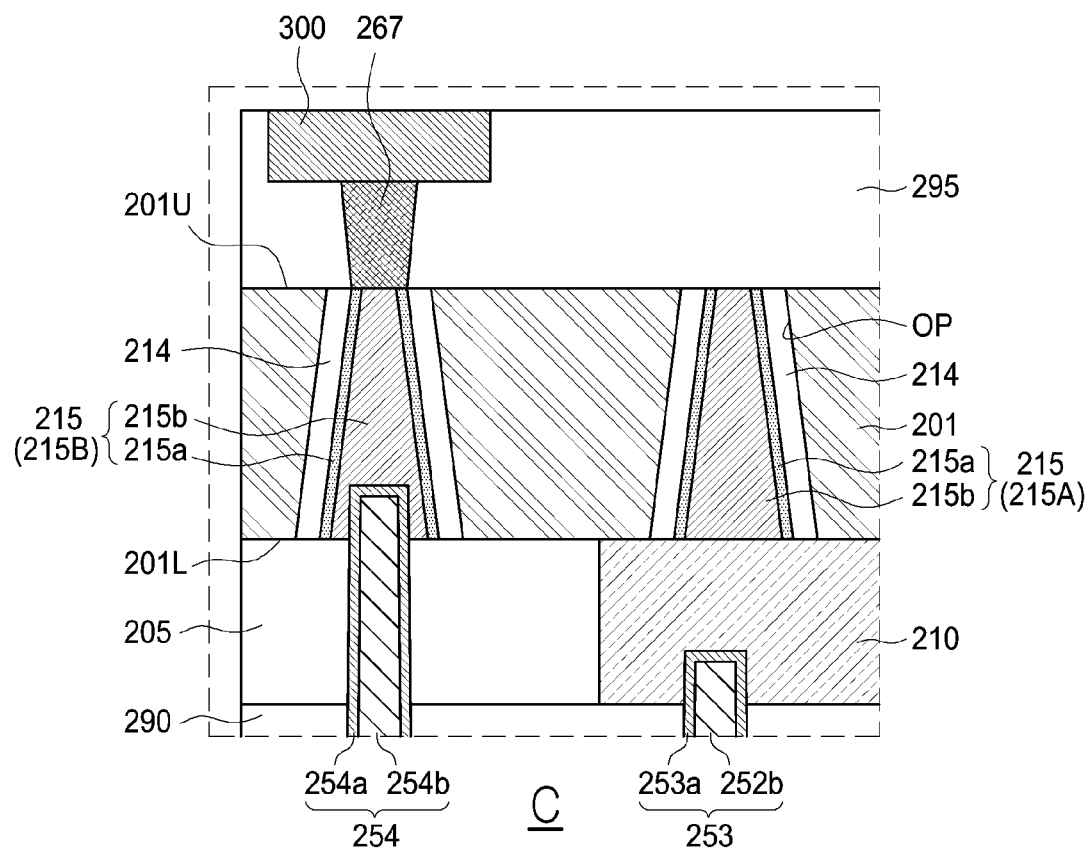
Figure 4C:
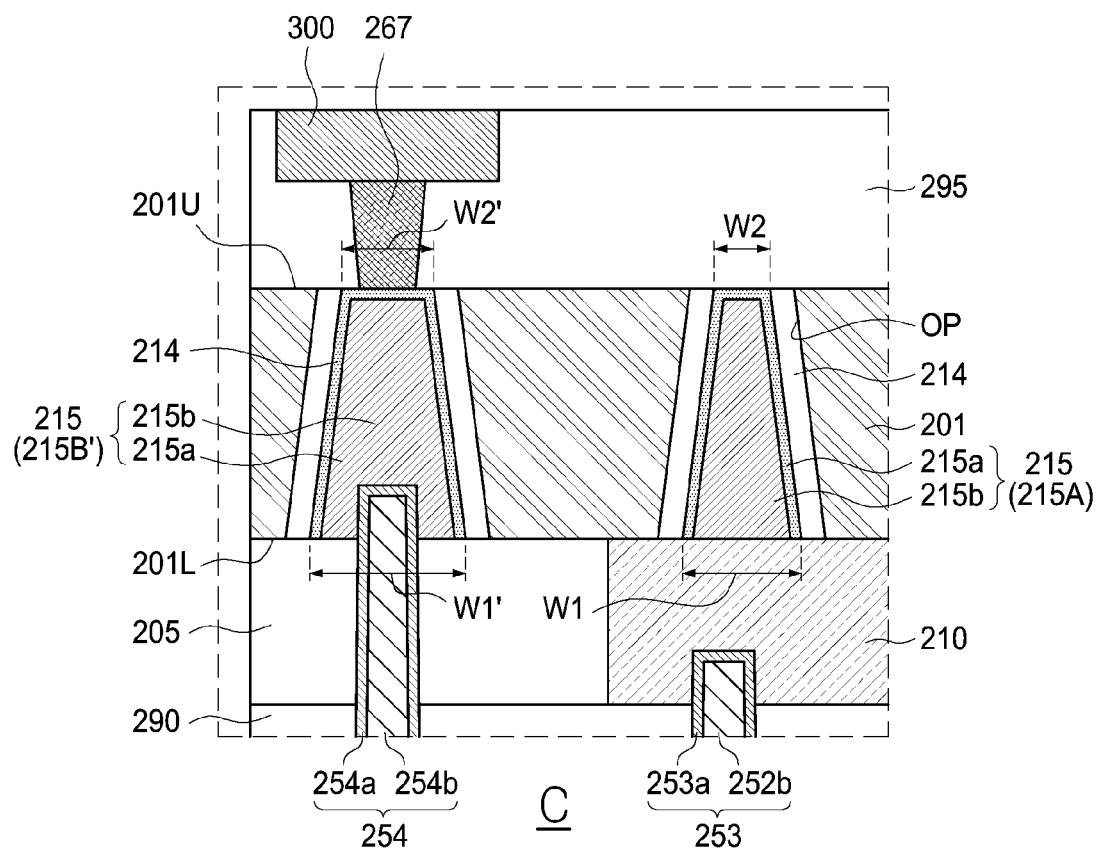

FIGS. 4A to 4C are partially enlarged cross-sectional views of a semiconductor device according to example embodiments. FIGS. 4A to 4C are enlarged views of a region corresponding to region "C" of FIG. 2.

Referring to FIG. 4A, a plurality of conductive patterns 215 may include a barrier layer 215a and a conductive layer 215b, and the barrier layer 215a may cover a side surface and an upper surface of the conductive layer 215b. The barrier layer 215a may include or may be formed of at least one of, for example, titanium (Ti), titanium nitride (TiN), tantalum (Ta), tantalum nitride (TaN), tungsten nitride (WN), and tungsten carbon nitride (WCN). The conductive layer 215b may include or may be formed of, for example, a metal such as tungsten (W), copper (Cu), or aluminum (Al). In the plurality of second conductive patterns 215B, a width W1 of a lower portion adjacent to a lower surface 201L of the second substrate 201 is greater than a width W2 of an upper portion.

Figure 15:
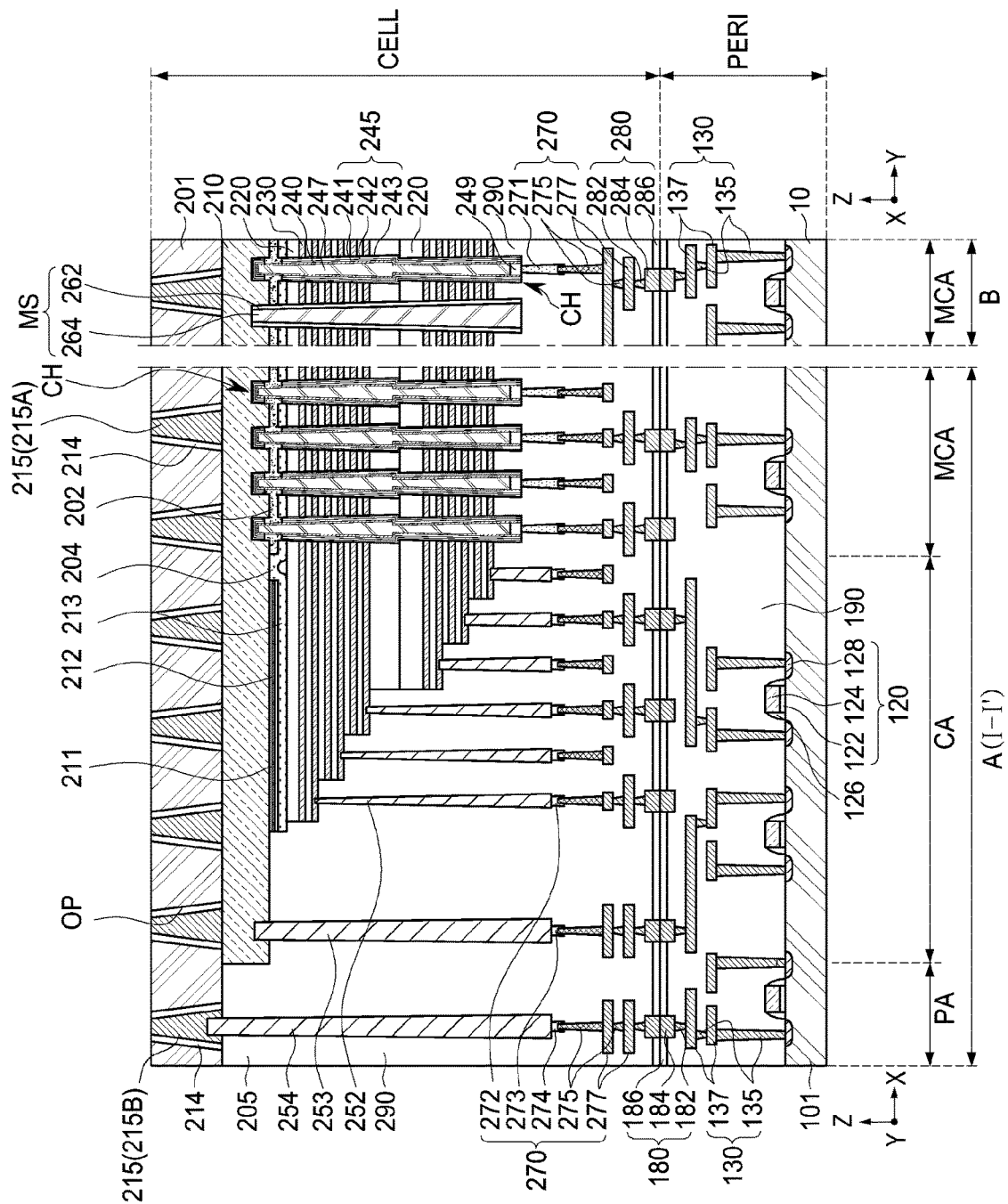

Referring to FIG. 4B, a plurality of conductive patterns 215 may include a barrier layer 215a and a conductive layer 215b, and the barrier layer 215a may cover a side surface of the conductive layer 215b. A portion of the barrier layer 215a, covering an upper surface of the conductive layer 215b, may be removed when the planarization process of FIG. 15 is performed, and the conductive layer 215b may be in contact with the peripheral contact via 267.

Referring to FIG. 4C, a plurality of conductive patterns 215 may include a barrier layer 215a and a conductive layer 215b, and a width of the second conductive pattern 215B' may be greater than a width of the first conductive pattern 215A. For example, a width W1' of a lower portion of the second conductive pattern 215B' may be greater than a width W1 of a lower portion of the first conductive pattern 215A, and a width W2' of an upper portion of the second conductive pattern 215B' may be greater than a width W2 of an upper portion of the first conductive pattern 215A. The second conductive pattern 215B' has a relatively greater width so that a peripheral contact plug 254 and a peripheral contact via 267 may be stably in contact with and connected to the second conductive pattern 215B'.

FIGS. 5A to 5D are plan views illustrating some components of a semiconductor device according to example embodiments.

Figure 5A:
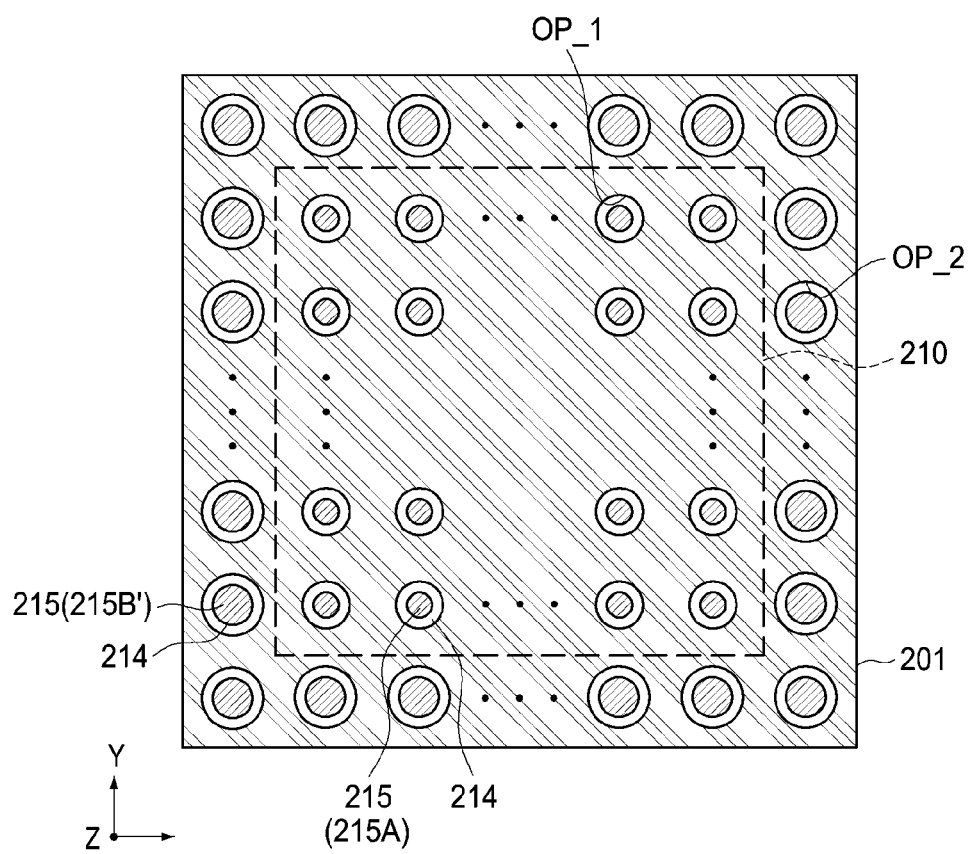
FIGS. 5A to 5D are plan views illustrating some components of a semiconductor device according to example embodiments.

As illustrated in FIG. 5A, which corresponds to FIG. 4C a width of a second conductive pattern 215B' is greater than a width of a first conductive pattern 215A. For example, a width of openings OP_2 in an external region PA may be greater than a width of openings OP_1 in a memory region MA in a second substrate 201. The memory region MA may represent a region including the memory cell array region MCA and the connection region CA of FIG. 2.

Figure 5B:
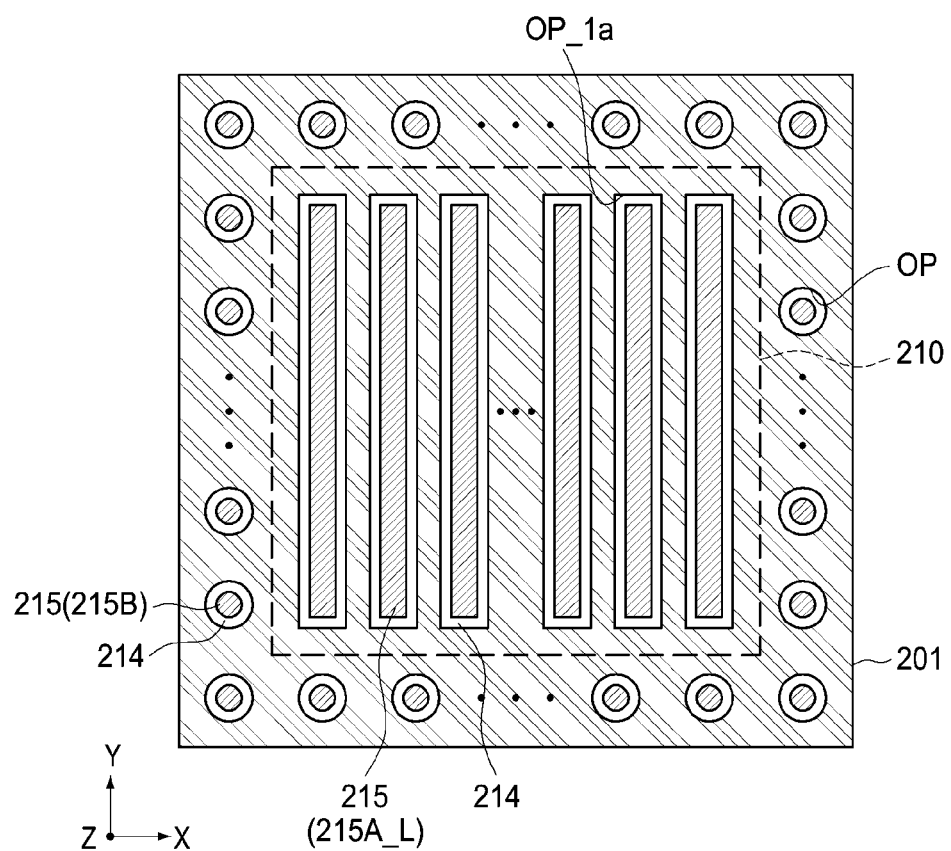

Referring to FIG. 5B, openings OP_1a may have a shape of an interconnection line extending in one direction in a memory cell array region MA and may have a shape of a via hole in an external region PA.

Figure 5C:
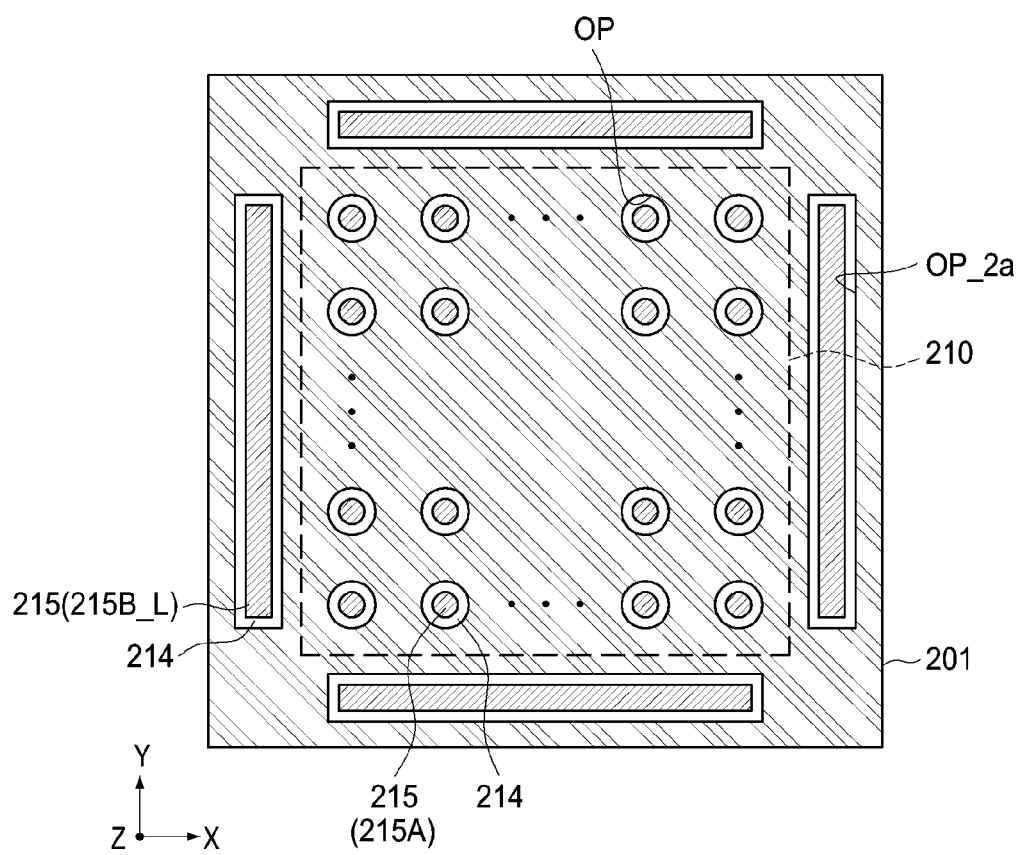

Referring to FIG. 5C, openings OP_2a may have a shape of an interconnection line in an external region PA and may have a shape of a via hole in a memory region MA. Although the line-type openings OP_2a are illustrated as being spaced apart from each other in the external region PA, example embodiments are not limited thereto and all of the line-type openings OP_2a may be connected to form a single pattern.

Figure 5D:
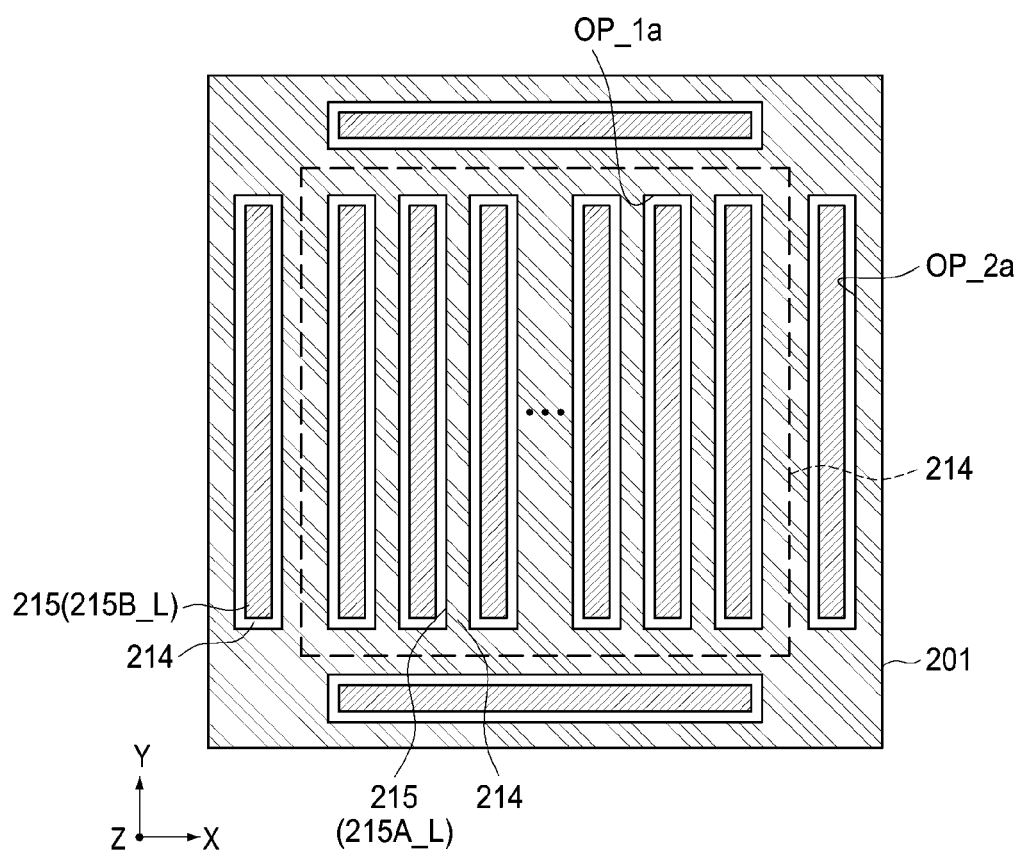

Referring to FIG. 5D, the openings OP_1a and OP_2a may have a shape of an interconnection line in a memory region MA and an external region PA.

A shape and arrangement of the patterns illustrated in FIGS. 5A to 5D are exemplary, and a planar shape and arrangement of the plurality of openings OP and the plurality of conductive patterns 215 may vary according to example embodiments. For example, the first conductive patterns 215 may be formed to have a predetermined pattern to implement circuit interconnection lines. For example, the second conductive patterns 215B may form a rectangular ring shape, or may be arranged in a line while having a rectangular or elliptical shape.

Figure 6A:
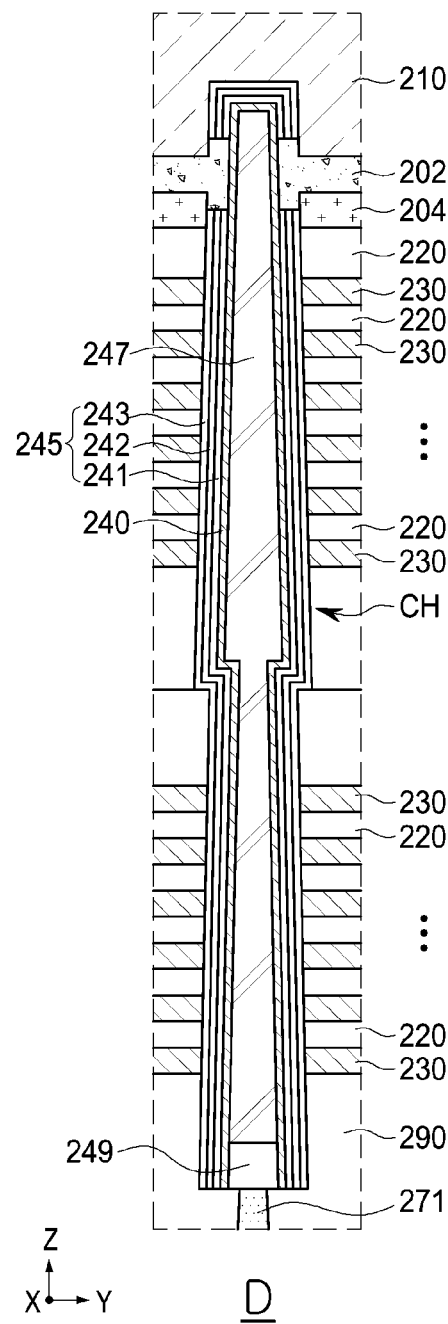
FIGS. 6A and 6B are partially enlarged cross-sectional views of a semiconductor device according to example embodiments.
Figure 6B:
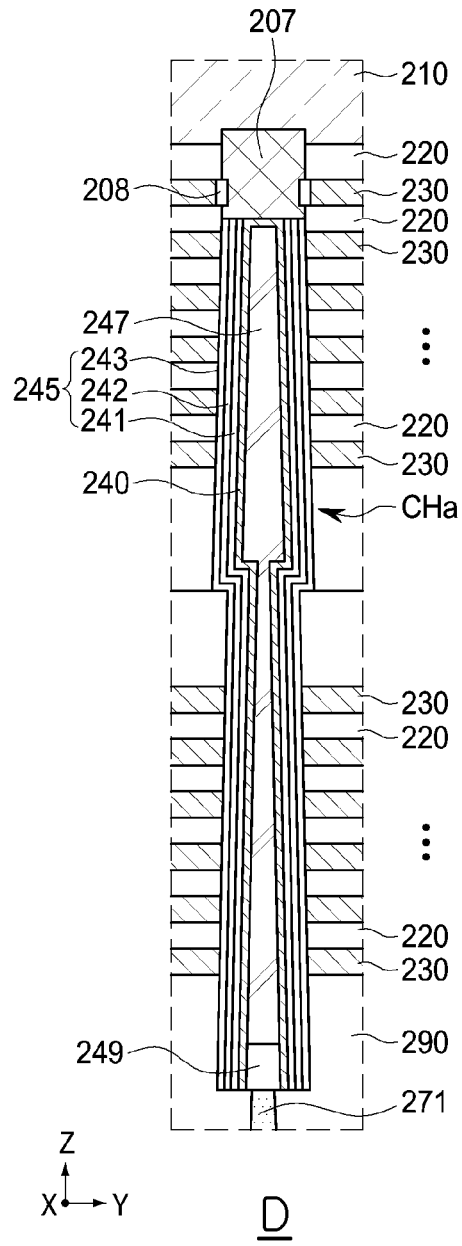

FIGS. 6A and 6B are partially enlarged cross-sectional views of a semiconductor device according to example embodiments. FIGS. 6A and 6B are enlarged views of a region corresponding to a region "D" of FIG. 2.

As illustrated in FIG. 6A, a channel layer 240 may be disposed in the channel structures CH. A channel layer 240 of a lower channel structure, penetrating through a lower stack structure of gate electrodes 230, and a channel layer 240 of an upper channel structure, penetrating through an upper stack structure of the gate electrode 230, may be in a state of being connected to each other. In the channel structures CH, the channel layer 240 may be formed to have an annular shape surrounding an internal core insulating layer 247. However, according to example embodiments, the channel layer 240 may have a columnar shape such as a cylindrical shape or a prismatic shape without the core insulating layer 247. An upper portion of the channel layer 240 may be connected to the first horizontal conductive layer 202. The channel layer 240 may include or may be formed of a semiconductor material such as polycrystalline silicon or single-crystalline silicon.

Channel pads 249 may be disposed below the channel layer 240 in the channel structures CH. The channel pads 249 may cover a lower surface of the core insulating layer 247 and be in contact with the channel layer 240. The channel pads 249 may include, for example, doped polysilicon.

The gate dielectric layer 245 may be disposed between the gate electrodes 230 and the channel layer 240. The gate dielectric layer 245 may be disposed between the conductive plate 210 and the channel layer 240. As illustrated in FIG. 6A, the gate dielectric layer 245 may include a tunneling layer 241, a data storage layer 242, and a blocking layer 243 sequentially stacked on the channel layer 240. The tunneling layer 241 may tunnel charges to the data storage layer 242 and may include or may be formed of, for example, a silicon oxide ($SiO_2$), a silicon nitride ($Si_3N_4$), a silicon oxynitride (SiON), or combinations thereof. The data storage layer 242 may include or may be formed of a silicon nitride ($Si_3N_4$) and may be a charge trap layer. The blocking layer 143 may include or may be formed of a silicon oxide ($SiO_2$), a silicon nitride ($Si_3N_4$), a silicon oxynitride (SiON), a high-k dielectric material, or combinations thereof. In some example embodiments, at least a portion of the gate dielectric layer 245 may extend in a horizontal direction along the gate electrodes 230.

Referring to FIG. 6B, a memory cell region CELL may not include the first and second horizontal conductive layers 202 and 204 below the conductive plate 210, unlike in the example embodiment of FIGS. 2 and 6A. In addition, a channel structure CHa may further include an epitaxial layer 207.

The epitaxial layer 207 may be disposed on an upper end of the channel structure CHa to be in contact with the conductive plate 210, and may be disposed on a side surface of the at least one gate electrode 230. The epitaxial layer 207 may be disposed in a recessed region of the conductive plate 210. A lower surface of the epitaxial layer 207 may be lower than a lower surface of an uppermost gate electrode 230 and higher than an upper surface of the lower gate electrode 230, but example embodiments are not limited thereto. A lower surface of the epitaxial layer 207 may be connected to the channel layer 240. A gate insulating layer 208 may be disposed between the epitaxial layer 207 and a gate electrode 230 adjacent to the epitaxial layer 207.

FIGS. 7 to 15 are schematic cross-sectional views illustrating a method of fabricating a semiconductor device according to example embodiments. Regions, corresponding to the regions illustrated in FIG. 2, are illustrated in FIGS. 7 to 15.

Figure 7:
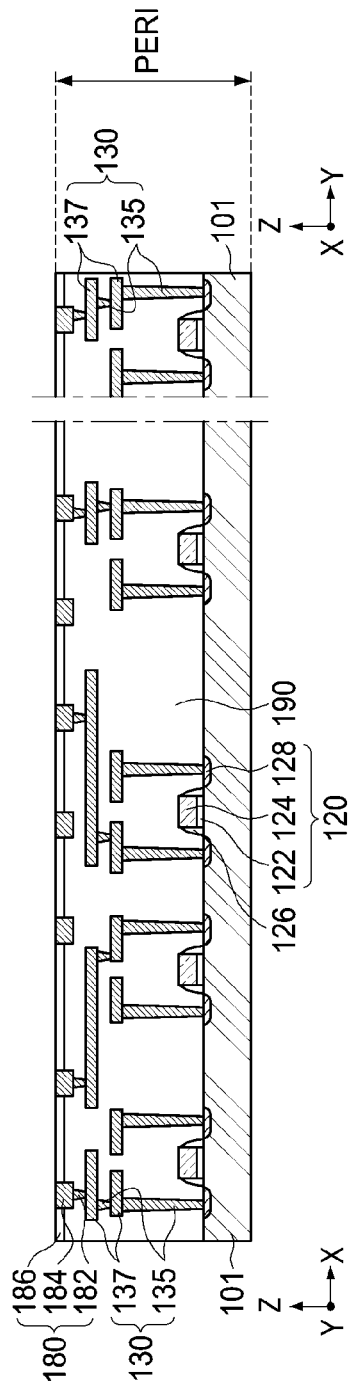
FIGS. 7 to 15 are schematic cross-sectional views illustrating a method of fabricating a semiconductor device according to example embodiments.

Referring to FIG. 7, circuit devices 120, a lower interconnection structure 130, a lower bonding structure 180, and a lower capping layer 190, constituting a peripheral circuit region PERI, may be formed on a first substrate 101.

Device isolation layers may be formed in the first substrate 101, and a circuit gate dielectric layer 122 and a circuit gate electrode 124 may be sequentially formed on the first substrate 101. The device isolation layers may be formed by, for example, a shallow trench isolation (STI) process. The circuit gate dielectric layer 122 may be formed on the first substrate 101, and the circuit gate electrode 124 may be formed on the circuit gate dielectric layer 122. Next, source/drain regions 128 may be formed by forming spacer layers 126 on opposite sidewalls of the circuit gate dielectric layer 122 and the circuit gate electrode 124 and implanting impurities into active regions of the first substrate 101 on opposite sides adjacent to the circuit gate electrode 124.

In the lower interconnection structure 130, lower contact plugs 135 may be formed by forming a portion of the lower capping layer 190, etching the portion to be removed, and filling the removed portion with a conductive material. The lower interconnection lines 137 may be formed by, for example, depositing a conductive material and patterning the deposited conductive material.

In the lower bonding structure 180, a lower bonding via 182 may be formed by forming a portion of the lower capping layer 190, etching the portion to be removed, and filling the removed portion with a conductive material. The lower bonding pad 184 may be formed by, for example, depositing a conductive material and patterning the deposited conductive material. The lower bonding structure 180 may be formed by, for example, a deposition process or a plating process. A lower bonding insulating layer 186 may be formed to cover a portion of the upper surface and a side surface of the lower bonding pad 184, and may then be planarized until an upper surface of the lower bonding pad 184 is exposed.

The lower capping layer 190 may include a plurality of insulating layers. The lower capping layer 190 may be a portion in each of the operations of forming the lower interconnection structure 130 and the lower bonding structure 180. Accordingly, a peripheral circuit region PERI may be formed.

Figure 8:
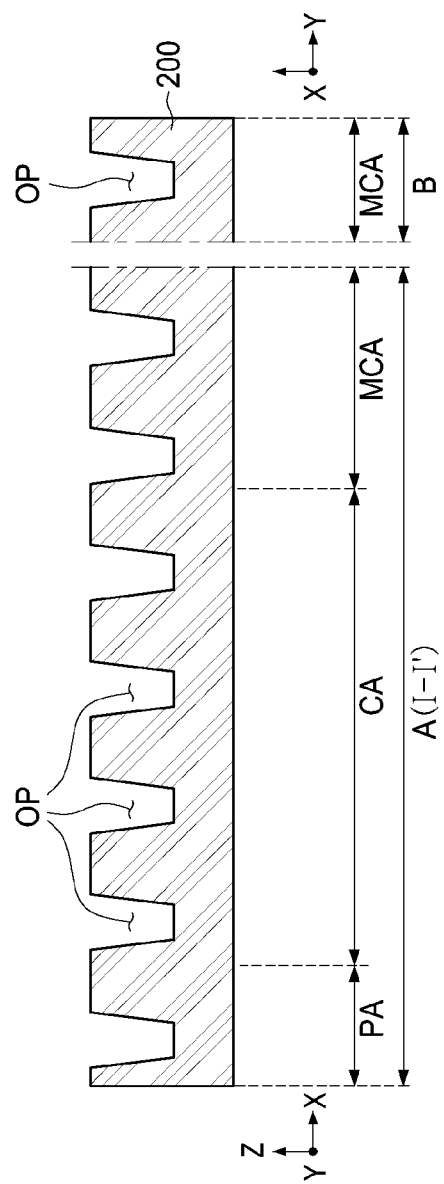

Referring to FIG. 8, a plurality of openings OP may be formed in a base substrate 200.

The base substrate 200 may have a shape of a semiconductor substrate before a planarization process, and may have a thickness greater than that of the second substrate 201. A portion of the base substrate 200 may be subsequently removed by the planarization process to form the second substrate 201. The plurality of openings OP may be formed by a patterning process of removing a portion of the base substrate 200.

Figure 9:
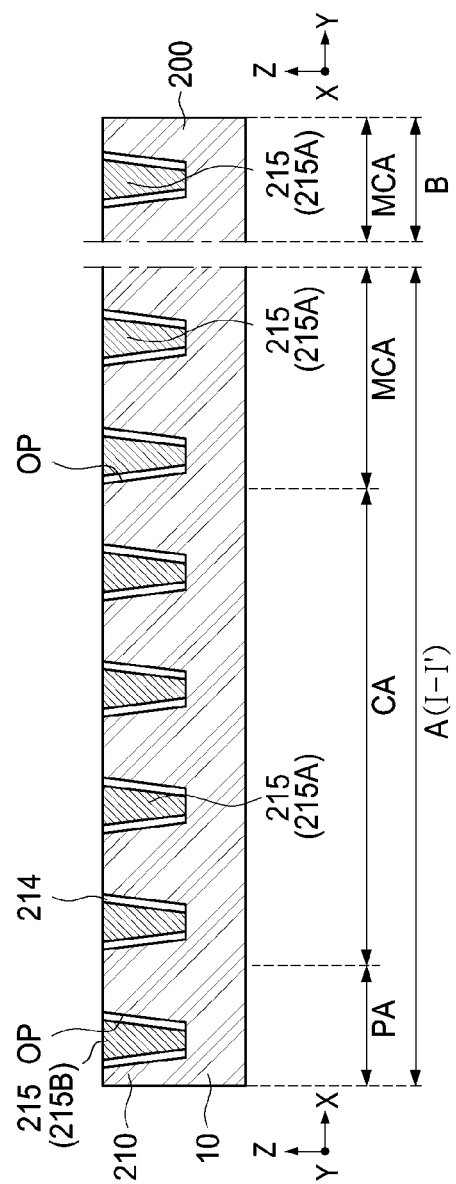

Referring to FIG. 9, a buffer insulating layer 214 and a conductive pattern 215 may be formed in the plurality of openings OP.

The buffer insulating layer 214 may be conformally formed in the plurality of openings OP, and the conductive pattern 215 may be formed to fill remaining spaces of the openings OP. After the buffer insulating layer 214 and the conductive pattern 215 are formed, a planarization process may be further performed. An upper surface of the conductive pattern 215 may be exposed through the planarization process. The conductive pattern 215 may be connected to the base substrate 201 in the opening OP. In another example embodiment, the conductive pattern 215 may not be connected to the base substrate 201 in the opening OP.

Figure 10:
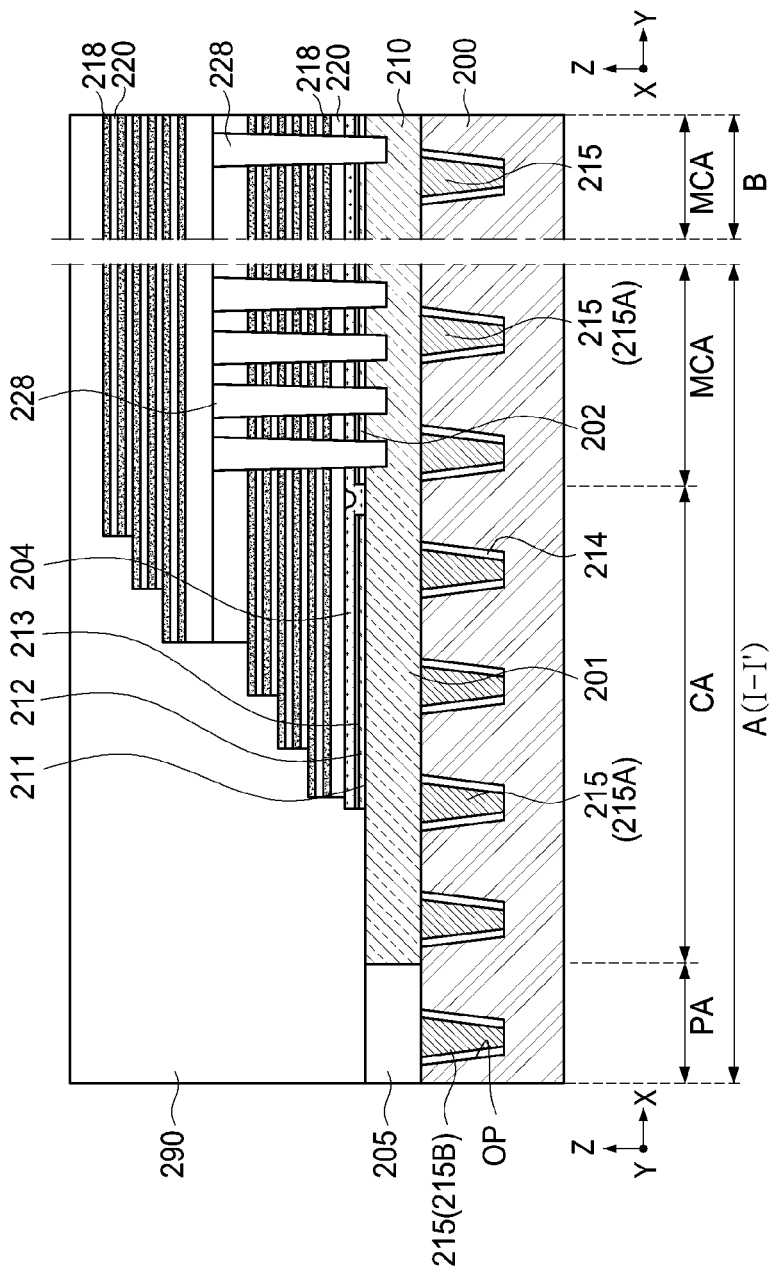

Referring to FIG. 10, a conductive plate 210 may be formed on the base substrate 200. First to third horizontal sacrificial layers 211, 212, 213 and a second horizontal conductive layer 204 may be formed on the conductive plate 210. The sacrificial insulating layers 218 and the interlayer insulating layers 220 may be alternately stacked to form a lower stack structure, a vertical sacrificial structure 228 may be formed to penetrate through the lower stack structure, and the sacrificial insulating layers 218 and the interlayer insulating layers 220 may be alternately stacked to form an upper stack structure.

A portion of the conductive plate 210 may be removed in an external region PA. An external insulating layer 205 may be formed in a region, in which the conductive plate 210 is removed, of the external region PA. Accordingly, the external insulating layer 205 and the conductive plate 210 may be formed in the same layer of a semiconductor structure. For example, an upper surface of the external insulating layer 205 may be substantially coplanar with an upper surface of the conductive plate 210 and a lower surface of the external insulating layer 205 may be substantially coplanar with a lower surface of the conductive plate 210. A side surface of the external insulating layer 205 may contact a side surface (external side) of the conductive plate 210. The conductive plate 210 and the external insulating layer 205 may be formed on the base substrate 200 to be in contact with the base substrate 200.

The first to third horizontal sacrificial layers 211, 212, and 213 may be sequentially stacked on the conductive plate 210. The first to third horizontal sacrificial layers 211, 212, and 213 may be replaced with the first horizontal conductive layer 202 of FIG. 2, formed through a subsequent process, in the memory cell array region MCA. The second horizontal conductive layer 204 may be formed on the third horizontal sacrificial layer 213.

A portion of the sacrificial insulating layers 218 may be replaced with the gate electrodes 230 (see FIG. 2) through a subsequent process. The sacrificial insulating layers 218 may be formed of a material, different from a material of the interlayer insulating layers 220, and may be formed of a material etched with etch selectivity with respect to the interlayer insulating layers 220 under specific etching conditions. For example, the interlayer insulating layer 220 may be formed of at least one of a silicon oxide and a silicon nitride, and the sacrificial insulating layers 218 may be formed of a material, different from a material of the interlayer insulating layer 220 selected from the group consisting of silicon, a silicon oxide, a silicon carbide, and a silicon nitride. In some embodiments, thicknesses of the interlayer insulating layers 220 may not all be the same. Thicknesses of the interlayer insulating layers 220 and the sacrificial insulating layers 218 and the number of layer constituting the interlayer insulating layers 220 and the sacrificial insulating layers 218 may be variously changed from those illustrated in the drawing.

A photolithography process and an etching process may be repeatedly performed on the sacrificial insulating layers 218 using mask layers such that overlying sacrificial insulating layers 218 extends by a distance shorter than underlying sacrificial insulating layers 218 in a connection region CA. Accordingly, the sacrificial insulating layers 218 may form a staircase-shaped step structure in a predetermined unit.

A vertical sacrificial structure 228 may be formed by anisotropically etching the lower stack structure of the sacrificial insulating layers 218 and the interlayer insulating layers 220 using a mask layer, and may be formed by forming hole-shaped lower channel holes and filling the lower channel holes. The vertical sacrificial structure 228 may include a semiconductor material such as polysilicon. In example embodiments, the vertical sacrificial structure 228 may include or may be formed of at least one of a silicon oxide, a silicon nitride, and a silicon oxynitride. After the vertical sacrificial structure 228 is formed, an upper stack structure of the sacrificial insulating layers 218 and the interlayer insulating layers 220 may be formed on the lower stack structure and the vertical sacrificial structure 228.

In the present operation, the plurality of conductive patterns 215 may serve as an align key during a photolithography process of forming a plurality of structures on the second substrate 201. The align key may be used to align the photomask with the base substrate/second substrate 201 before exposure during the photolithography process.

Next, a portion of an upper capping layer 290 may be formed to cover a stack structure of the sacrificial insulating layers 218 and the interlayer insulating layers 220.

Figure 11:
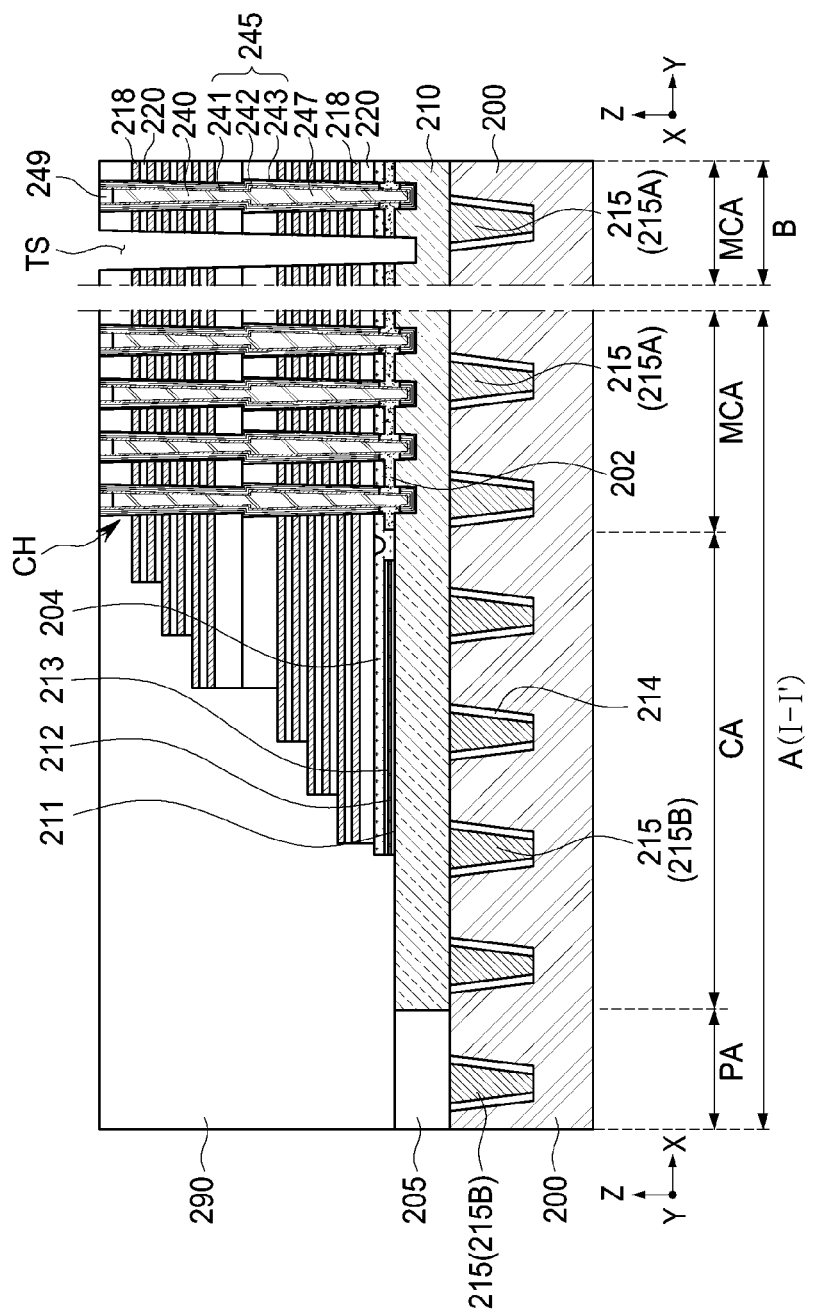
Figure 12:
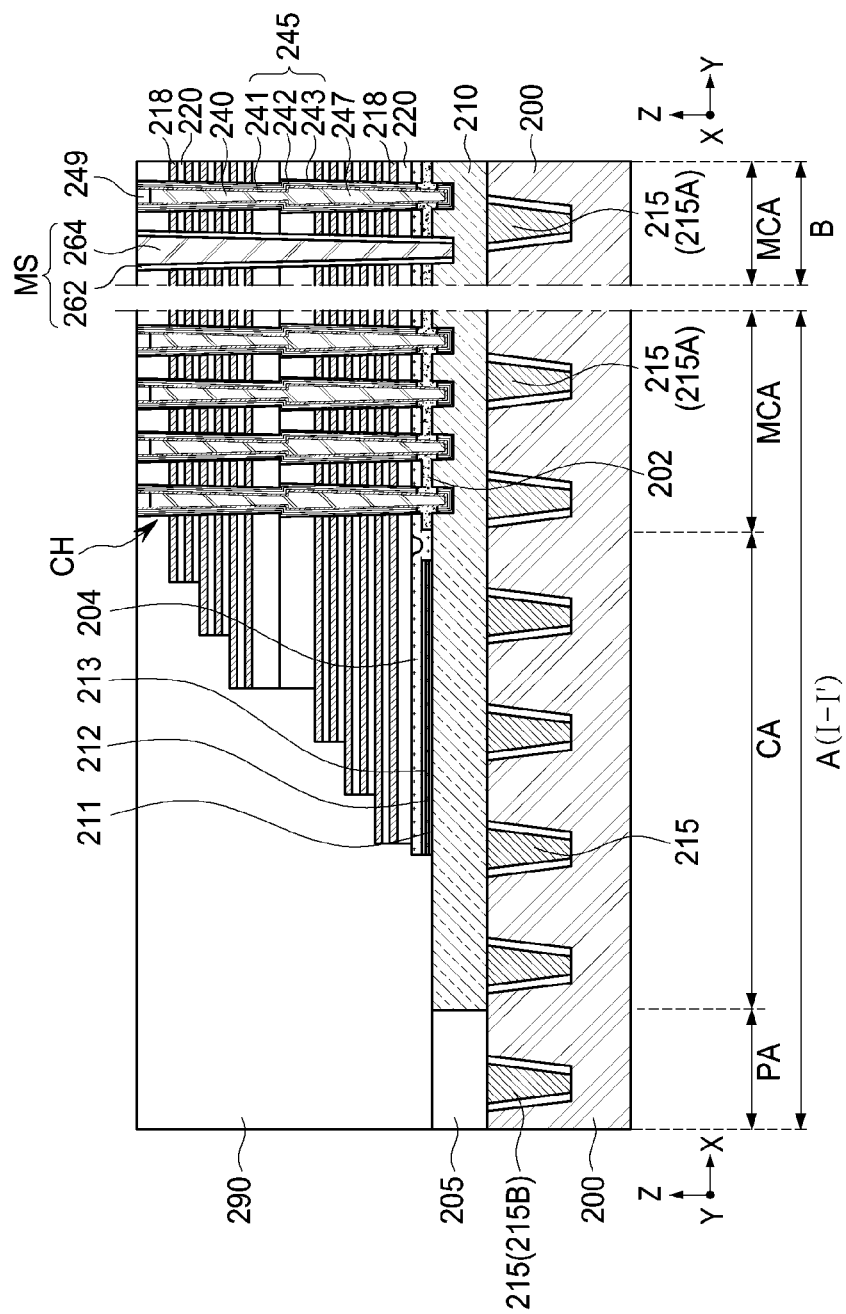

Referring to FIG. 11, channel structures CH may be formed to penetrate through the stack structure of the sacrificial insulating layers 218 and the interlayer insulating layers 220. In a region corresponding to a separation region MS (see FIG. 2), a trench-shaped separation opening TS may be formed to penetrate through the stack structure of the sacrificial insulating layers 218 and the interlayer insulating layers 220.

The channel structures CH may be formed by filling hole-shaped channel holes with a plurality of layers. The plurality of layers may include a gate dielectric layer 245, a channel layer 240, a core insulating layer 247, and a channel pad 249. Upper portions of the channel holes may be formed by anisotropically etching the upper stack structure of the sacrificial insulating layers 218 and the interlayer insulating layers 220 using an additional mask layer. Lower portions of the channel holes may be formed by removing the vertical sacrificial structure 228 exposed through the upper portions of channel holes. When a plasma dry etching process is used during formation of the channel holes, a potential difference may occur in upper and lower portions of the channel holes due to ions generated in the channel holes. However, since the second horizontal conductive layer 204 and the conductive plate 210 are connected to the base substrate 200, for example, positive charges may flow to the base substrate 200 and negative charges moving through the mask layer may flow to the base substrate 200. Thus, arcing caused by the potential difference may be prevented from occurring.

Due to a height of the stack structure, sidewalls of the channel structures CH may not be perpendicular an upper surface of the conductive plate 210. The formation of the channel structures CH may also form a recess in a portion of the conductive plate 210.

The gate dielectric layer 245 may be formed to have a uniform thickness. In the present operation, an entirety or a portion of the gate dielectric layer 245 may be formed. A portion of the gate dielectric layer 245, extending in a direction perpendicular to the conductive plate 210 along the channel structures CH, may be formed in the present operation. The channel layer 240 may be formed on the gate dielectric layer 245 in the channel structures CH. The core insulating layer 247 may be formed to fill the channel structures CH, and may include an insulating material. The channel pad 249 may be formed of a conductive material, for example, polysilicon.

Next, a trench-type separation opening TS may be formed to penetrate through the stack structure of the sacrificial insulating layers 218 and the interlayer insulating layers 220 and to penetrate through the second horizontal conductive layer 204 and the first to third horizontal sacrificial layers 211, 212, and 213 in a lower portion thereof. The formation of separation opening TS may also form a recess in a portion of the conductive plate 210.

After the separation opening TS is formed, the second horizontal sacrificial layer 212 may be exposed through an etch-back process while forming additional sacrificial spacer layers in the separation opening TS. The second horizontal sacrificial layer 212 may be selectively removed from the exposed region in the memory cell array region MCA, and the upper and lower first and third horizontal sacrificial layers 211 and 213 may then be removed.

The first to third horizontal sacrificial layers 211, 212, and 213 may be removed from the exposed region in the memory cell array region MCA by an etching process. In the process of removing the first and third horizontal sacrificial layers 211 and 213, a portion of the gate dielectric layer 245, exposed in the region in which the second horizontal sacrificial layer 212 is removed, may also be removed. After a first horizontal conductive layer 202 is formed by depositing a conductive material on the region in which the first to third horizontal sacrificial layers 211, 212, and 213 are removed, the sacrificial spacer layers may be removed in the separation opening TS. By the present process, a first horizontal conductive layer 202 may be formed in the memory cell array region MCA, and the first to third horizontal sacrificial layers 211, 212, and 213 may remain in the connection region CA Referring to FIG. 12, the sacrificial insulating layers 218 may be removed through the separation opening TS to form gate electrodes 230. The separation region MS may be formed in the separation opening TS.

The sacrificial insulating layers 218 may be removed through the separation opening TS to form tunnel portions, and the tunnel portions may be filled with a conductive material to form gate electrodes 230. The conductive material may include or may be formed of a metal, polysilicon, or a metal silicide. After the gate electrodes 230 are formed, the conductive material deposited in the separation opening TS may be removed through an additional process, and the separation region MS may then be formed by filling the removed portion with an insulating material and a conductive material.

Figure 13:
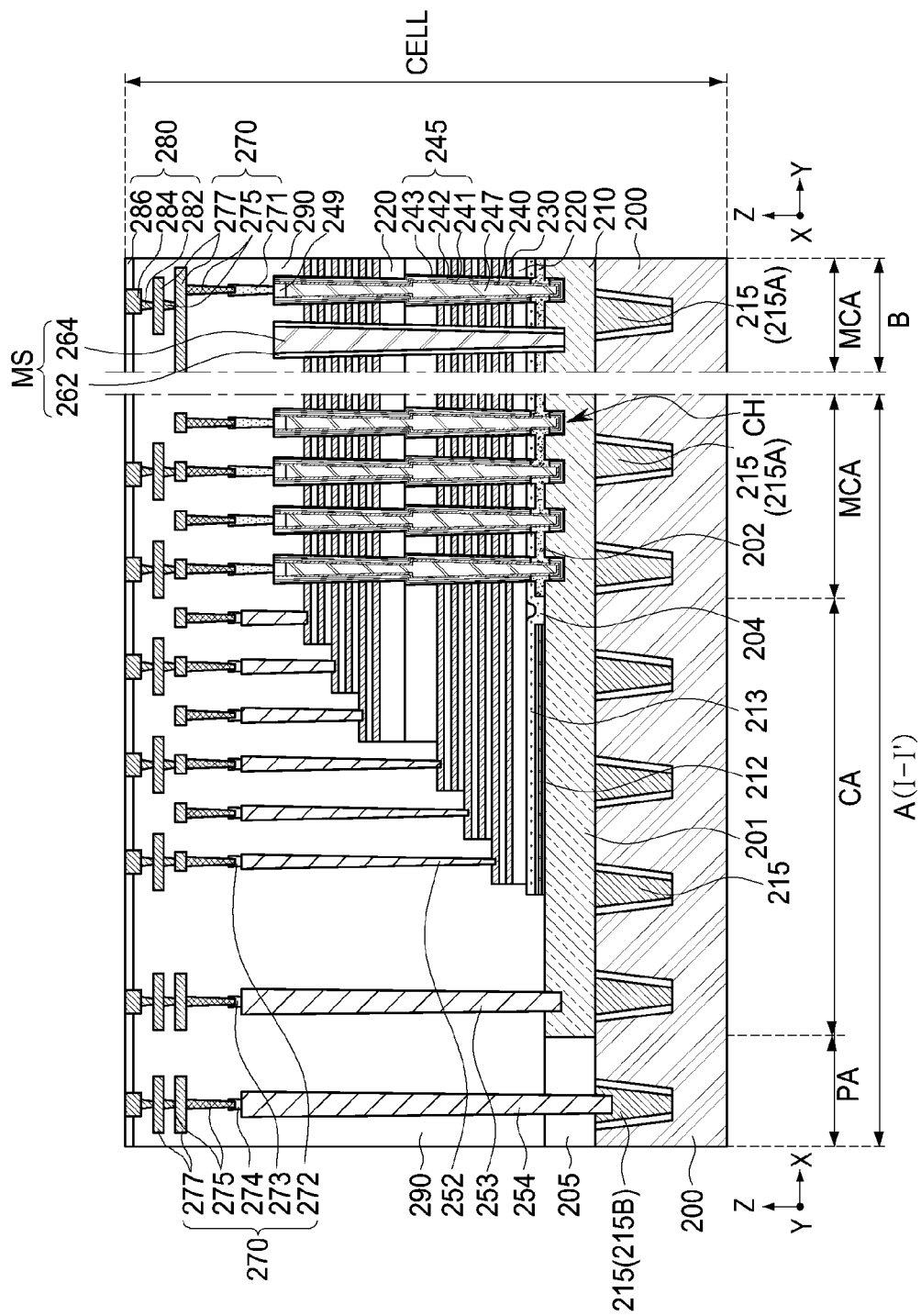

Referring to FIG. 13, an upper interconnection structure 270 including gate contact plugs 252, source contact plugs 253, peripheral contact plugs 254, and channel contact plugs 271 may be formed, and an upper bonding structure 280 may be formed.

The gate contact plugs 252 may be formed to be connected to the gate electrodes 230 in the connection region CA, and the source contact plugs 253 and the peripheral contact plugs 254 may be formed to be connected to the base substrate 200 in the external region PA. The channel contact plugs 271 may be formed to be connected to the channel structures CH in the memory cell array region MCA. The gate contact plugs 252, the source contact plugs 253, and the peripheral contact plugs 254 may be formed to have different depths, but may be formed by simultaneously forming contact holes using an etch-stop layer, or the like, and filling the contact holes with a conductive material. In example embodiments, a portion of the gate contact plugs 252, the source contact plugs 253, and the peripheral contact plugs 254 may be formed in other process operations.

Contact studs 272, 273, and 274 may be formed to be connected to the gate contact plugs 252, the source contact plugs 253, and the peripheral contact plugs 254, respectively. Upper contact plugs 275 may be formed on the contact studs 272, 273, and 274 and may vertically connect upper interconnection lines 277 to each other.

Next, an upper bonding structure 280 may be formed in a manner, similar to the manner in which the lower bonding structure 180 is formed. Accordingly, a memory cell region CELL may be formed. However, the memory cell region CELL may be in a state of further including the base substrate 200 during the process of fabricating the semiconductor device.

Figure 14:
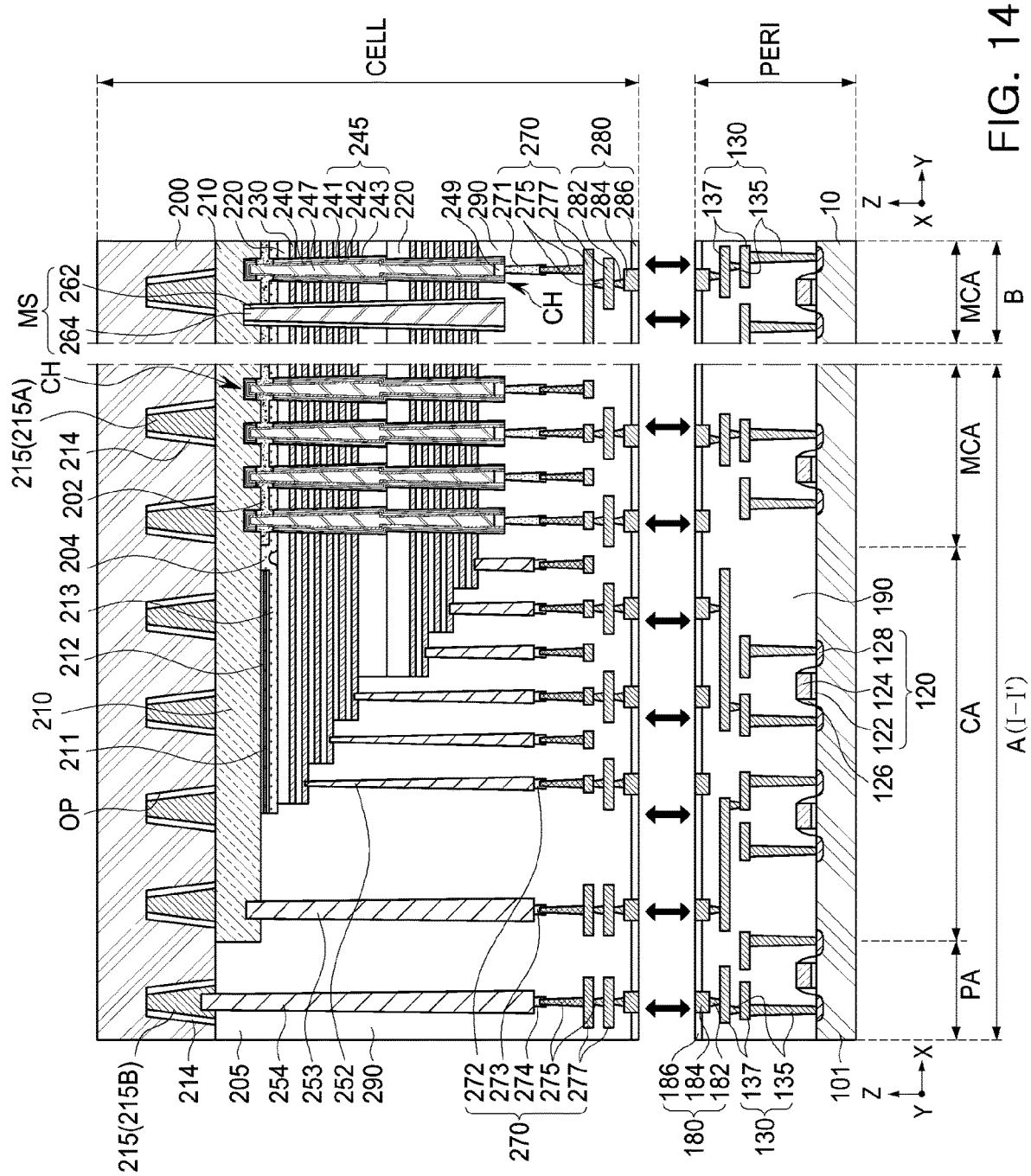

Referring to FIG. 14, the peripheral circuit region PERI, a first substrate structure, and the memory cell region CELL, a second substrate structure, may be bonded to each other.

The peripheral circuit region PERI and the memory cell region CELL may be connected to each other by bonding the lower bonding pad 184 and the upper bonding pad 284 by applying a pressure. A lower bonding insulating layer 186 and an upper bonding insulating layer 286 may be bonded to be connected to each other by applying a pressure. The memory cell region CELL may be turned over on the peripheral circuit region PERI to be bonded such that the upper bonding pad 284 is directed downwardly. The peripheral circuit region PERI and the memory cell region CELL may be directly bonded without interposing an adhesive such as an additional adhesive layer therebetween.

Referring to FIG. 15, a portion of the base substrate 200 may be removed by a planarization process to form a second substrate 201.

The base substrate 200 may be removed by, for example, a polishing process such as a grinding process or a chemical mechanical polishing (CMP) process. A portion of the base substrate 200 may be removed from a rear surface thereof to expose an upper surface of each of the buffer insulating layer 214 and the conductive pattern 215. The portion of the base substrate 200 is removed, so that a second substrate 201 may be formed. The plurality of conductive patterns 215 may serve as a stopper during a planarization process in the present operation. For example, a planarization process of removing a portion of the base substrate 200 from the rear surface thereof may be performed until upper surfaces of the plurality of conductive patterns 215 are exposed. The plurality of conductive patterns 215 may be formed of a material, different from a material of the base substrate 200.

Next, a portion of the upper insulating layer 295 may be formed, and a peripheral contact via 267 and a conductive pad 300 may be formed. The peripheral contact via 267 may be formed by forming a via hole to penetrate through a portion of the second upper insulating layer 295 and filling the via hole with a conductive material. The conductive pad 300 may also be formed by removing a portion the second upper insulating layer 295 and filling the removed portion with a conductive material. As a result, the semiconductor device 100 of FIGS. 1 to 3 may be fabricated.

Figure 16:
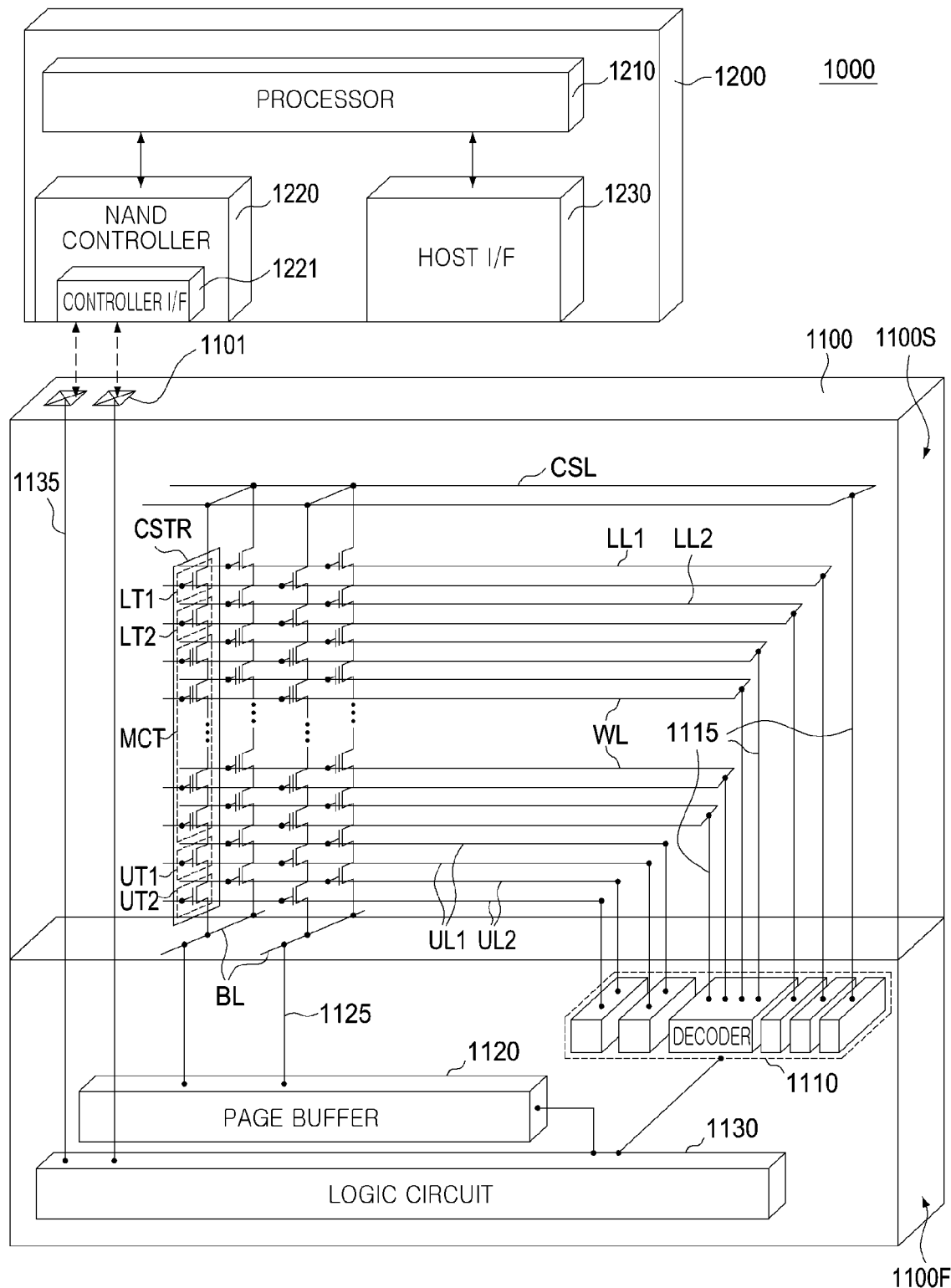
FIG. 16 is a schematic diagram of a data storage system including a semiconductor device according to example embodiments.

FIG. 16 is s a schematic diagram of a data storage system including a semiconductor device according to example embodiments.

Referring to FIG. 16, a data storage system 1000 may include a semiconductor device 1100 and a controller 1200 electrically connected to the semiconductor device 1100. The data storage system 1000 may be implemented by a storage device including one or more semiconductor devices 1100 or an electronic device including the storage device. For example, the data storage system 1000 may be implemented by a solid state drive device (SSD) including one or more semiconductor devices 1100, a universal serial bus (USB), a computing system, a medical device, or a communications device.

The semiconductor device 1100 may be implemented as a nonvolatile memory device, and may be implemented as, for example, the NAND flash memory device described in the example embodiment described above with reference to FIGS. 1 to 8. The semiconductor device 1100 may include a first structure 1100F and a second structure 1100S on the first structure 1100F. In some example embodiments, the first structure 1100F may be disposed alongside the second structure 1100S. The first structure 1100F may be implemented as a peripheral circuit structure including a decoder circuit 1110, a page buffer 1120, and a logic circuit 1130. The second structure 1100S may be implemented as a memory cell structure including a bitline BL, common source line CSL, wordlines WL, first and second gate upper lines UL1 and UL2, first and second gate lower lines LL1 and LL2, and memory cell strings CSTR between the bitline BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may vary according to example embodiments.

In some example embodiments, the upper transistors UT1 and UT2 may include a string select transistor, and the lower transistors LT1 and LT2 may include a ground select transistor. The lower gate lines LL1 and LL2 may be configured as gate electrodes of the lower transistors LT1 and LT2, respectively. The word lines WL may be configured as gate electrodes of the memory cell transistors MCT, and the upper gate lines UL1 and UL2 may be configured as gate electrodes of the upper transistors UT1 and UT2, respectively.

In some example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 or the upper erase control transistor UT1 may be used for an erase operation to erase data stored in the memory cell transistors MCT based on GIDL.

The common source line CSL, the first and second gate lower lines LL1 and LL2, the word lines WL, and the first and second gate upper lines UL1 and UL2 may be electrically connected to the decoder circuit 1110 through first connection lines 1115 extending from the first structure 1100F to the second structure 1100S. The bitlines BL may be electrically connected to the page buffer 1120 through second connection lines 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input and output pad 1101 electrically connected to the logic circuit 1130. The input and output pad 1101 may be electrically connected to the logic circuit 1130 through an input and output connection interconnection 1135 extending from the first structure 1100F to the second structure 1100S.

The controller 1200 may include a processor 1210, a NAND controller 1220, and a host interface 1230. In some example embodiments, the data storage system 1000 may include a plurality of semiconductor devices 1100. In this case, the controller 1200 may control the plurality of semiconductor devices 1100.

The processor 1210 may control overall operations of the data storage system 1000 including the controller 1200. The processor 1210 may operate according to a desired (or alternatively, predetermined) firmware, and may access the semiconductor device 1100 by controlling the NAND controller 1220. The NAND controller 1220 may include a NAND interface 1221 for processing communication with the semiconductor device 1100. Through the NAND interface 1221, a control command for controlling the semiconductor device 1100, data to be written in the memory cell transistors MCT of the semiconductor device 1100, and data to be read from the memory cell transistors MCT may be transmitted. The host interface 1230 may provide a communication function between the data storage system 1000 and an external host. When a control command is received from an external host through the host interface 1230, the processor 1210 may control the semiconductor device 1100 in response to the control command.

Figure 17:
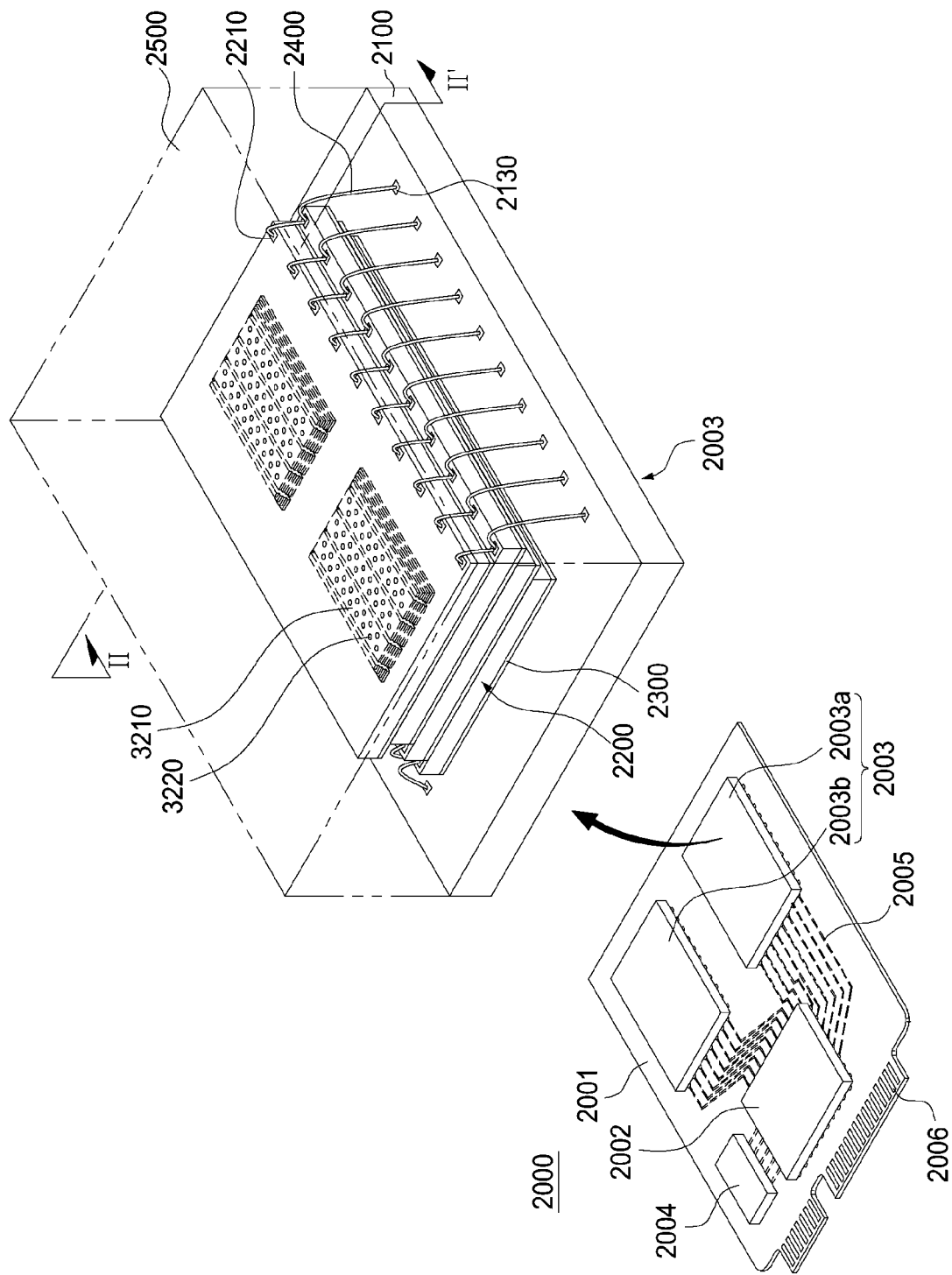
FIG. 17 is a schematic diagram of a data storage system including a semiconductor device according to example embodiments.

FIG. 17 is s a schematic diagram of a data storage system including a semiconductor device according to example embodiments.

Referring to FIG. 17, a data storage system 2000 in an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and the arrangement of the plurality of pins in the connector 2006 may vary depending on a communication interface between the data storage system 2000 and an external host. In some example embodiments, the data storage system 2000 may communicate with an external host according to one of interfaces such as universal serial bus (USB), peripheral component interconnect express (PCI-Express), serial advanced technology attachment (SATA), M-PHY for universal flash storage (UFS), and the like. In some example embodiments, the data storage system 2000 may be operated by power supplied from an external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be implemented as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, and adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including the package upper pads 2130. Each semiconductor chip 2200 may include an input/output pad 2210. The input/output pad 2210 may correspond to the input/output pad 1101 of FIG. 16 and may include the conductive pad 300 of FIG. 2. Each of the semiconductor chips 2200 may include gate stack structures 3210 and channel structures 3220. Each of the semiconductor chips 2200 may include the semiconductor device described in the example embodiment described above with reference to FIGS. 1 to 6B.

In some example embodiments, the connection structure 2400 may be configured as a bonding wire electrically connecting the input and output pad 2210 to the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In some example embodiments, in each of the first and second semiconductor packages 2003a and 2003b, the semiconductor chips 2200 may be electrically connected to each other by a connection structure including a through-silicon via (TSV), rather than the connection structure 2400 of a bonding wire type.

In some example embodiments, the controller 2002 and the semiconductor chips 2200 may be included in a single package. In an example embodiment, the controller 2002 and the semiconductor chips 2200 may be mounted on an interposer substrate separate from the main substrate 2001, and the controller 2002 may be connected to the semiconductor chips 2200 by an interconnection formed on the interposer substrate.

Figure 18:
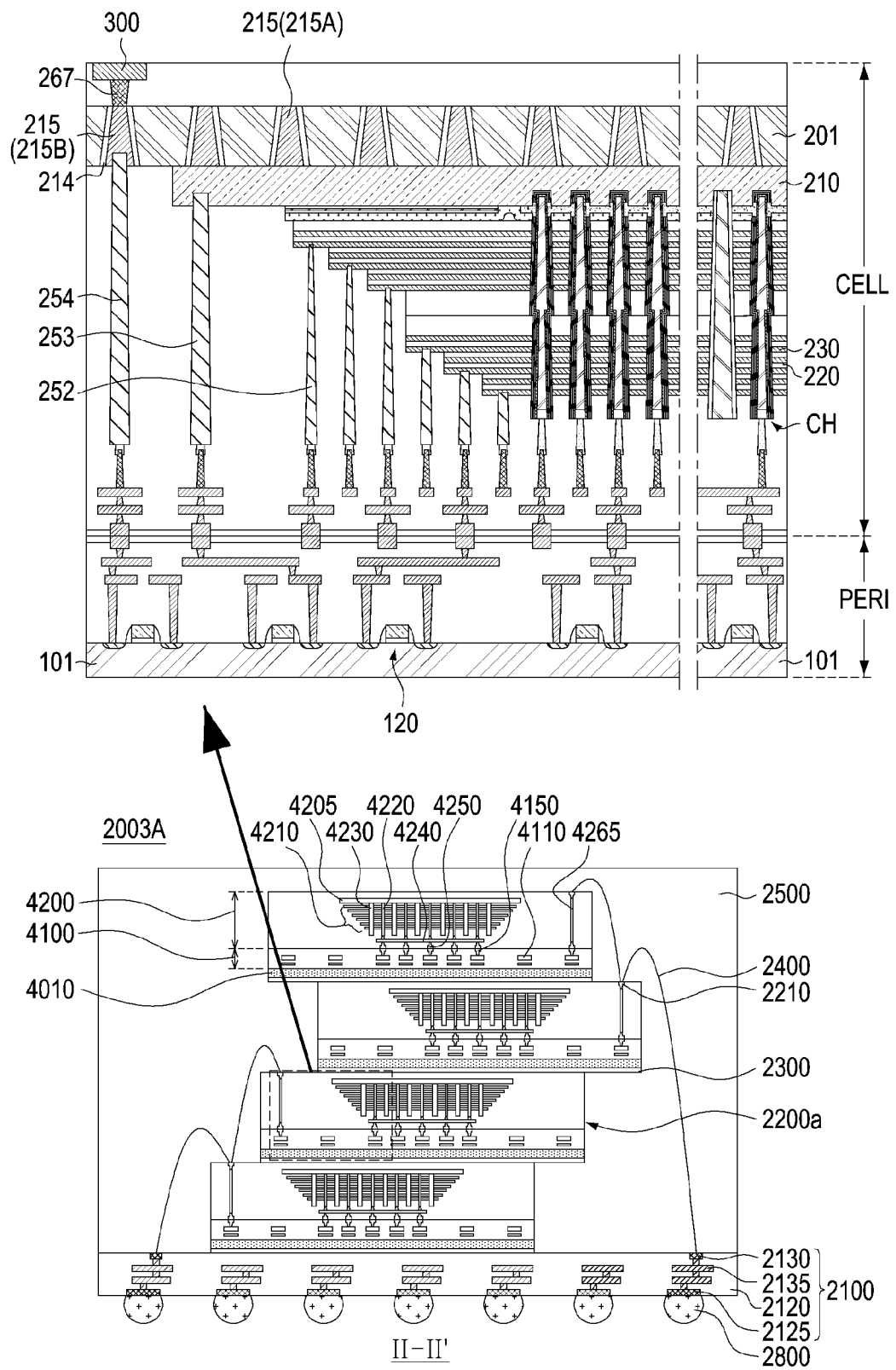
FIG. 18 is a schematic cross-sectional view of a semiconductor package according to example embodiments.

FIG. 18 is a schematic cross-sectional view of a semiconductor package according to example embodiments. FIG. 18 illustrates an example embodiment of the semiconductor package of FIG. 16, and conceptually illustrates a region of FIG. 16 taken along line II-II'.

Referring to FIG. 18, in a semiconductor package 2003, a package substrate 2100 may be configured as a printed circuit board. The package substrate 2100 may include a package substrate body portion 2120, package upper pads 2130 (see FIG. 17) disposed on the upper surface of the package substrate body portion 2120, lower pads 2125 disposed on or exposed through the lower surface of the package substrate body portion 2120, and internal interconnections 2135 electrically connecting the upper pads 2130 to the lower pads 2125 in the package substrate body 2120. The upper pads 2130 may be electrically connected to the connection structures 2400. The lower pads 2125 may be connected to the interconnection patterns 2005 of the main substrate 2010 of the data storage system 2000 as illustrated in FIG. 17 through conductive connection portions 2800.

In the semiconductor package 2003A, each of the semiconductor chips 2200a may include a semiconductor substrate 4010, a first structure 4100 on the semiconductor substrate 4010, and a second structure 4200 bonded to the first structure 4100 in a wafer bonding manner on the first structure 4100.

The first structure 4100 may include a peripheral circuit region including the peripheral interconnection 4110 and the first bonding structures 4150. The second structure 4200 may include a common source line 4205, a gate stack structure 4210 between the common source line 4205 and the first structure 4100, memory channel structures 4220 and a separation structure 4230 penetrating through the gate stack structure 4210, and second bonding structures 4250, respectively electrically connected to wordlines (WL of FIG. 16) of the memory channel structures 4220 and the gate stack structure 4210. For example, the second bonding structures 4250 may be electrically connected to the memory channel structures 4220 and the wordlines (WL of FIG. 16) through bitlines 4240 electrically connected to the memory channel structures 4220 and gate interconnections (252 of FIG. 2) electrically connected to the wordlines (WL of FIG. 1), respectively. The first bonding structures 4150 of the first structure 4100 and the second bonding structures 4250 of the second structure 4200 may be bonded to each other while being in contact with each other. Bonded portions of the first bonding structures 4150 and the second bonding structures 4250 may be formed of, for example, copper (Cu).

As illustrated in the enlarged view, each of the first structure 4100 and the second structure 4200 may include a peripheral circuit region PERI and a memory cell array region CELL. As illustrated in the enlarged view, each of the semiconductor chips 2200a may include a first substrate 101, a second substrate having a plurality of openings OP, and a buffer insulating layer 214 and a conductive pattern 215 disposed in the plurality of openings OP, gate electrodes 230, channel structures CH, and a peripheral contact plug 254. Each of the semiconductor chips 2200a may further include an input/output pad 2210 and an input/output interconnection 4265 below the input/output pad 2210. The input/output interconnection 4265 may be electrically connected to a portion of the second bonding structures 4210. The input/output interconnection 4265 may correspond to the peripheral contact plug 254 in the enlarged view, and the input/output pad 2210 may correspond to the conductive pad 300 in the enlarged view.

The semiconductor chips 2200 of FIG. 16 and the semiconductor chips 2200A of FIG. 17 may be electrically connected to each other by bonding wire-type connection structures 2400. However, in example embodiments, semiconductor chips in a single semiconductor package, such as the semiconductor chips 2200 of FIG. 16 and the semiconductor chips 2200A of FIG. 17, may be electrically connected to each other by a connection structure including a through-silicon via (TSV).

As described above, a plurality of conductive patterns may be disposed in a plurality of openings of a substrate to provide a semiconductor device, having a simplified fabrication process and improved electrical characteristics and reliability, and a data storage system including the semiconductor device.

While example embodiments have been shown and described above, it will be apparent to those skilled in the art that modifications and variations could be made without departing from the scope of the present inventive concept as defined by the appended claims.

What is claimed is:

1. A semiconductor device comprising:
   a first semiconductor structure including a first substrate, circuit devices disposed on the first substrate, lower interconnection structure electrically connected to the circuit devices, and a lower bonding structure connected to the lower interconnection structure; and
   a second semiconductor structure including a second substrate disposed on the first semiconductor structure and having a plurality of openings, a plurality of conductive patterns, respectively disposed in the plurality of openings, a buffer insulating layer disposed on side surfaces of the plurality of conductive patterns in the plurality of openings, a conductive plate disposed below the second substrate, gate electrodes spaced apart from each other and stacked in a vertical direction, perpendicular to a lower surface of the conductive plate, channel structures penetrating through the gate electrodes, extending in the vertical direction, and each including a channel layer, a plurality of peripheral contact plugs extending in the vertical direction and disposed in an external region from the conductive plate, an upper interconnection structure disposed below the gate electrodes and the channel structures, and an upper bonding structure connected to the upper interconnection structure and bonded to the lower bonding structure,
- wherein each of the plurality of conductive patterns has a shape in which a width decreases from a lower surface of the second substrate to an upper surface of the second substrate,
- wherein the plurality of conductive patterns include a plurality of first conductive patterns overlapping the conductive plate in the vertical direction and a plurality of second conductive patterns spaced apart from the conductive plate in the vertical direction, and
- wherein the plurality of peripheral contact plugs are connected to the plurality of second conductive patterns, respectively.

2. The semiconductor device of claim 1, wherein lower ends of the plurality of first conductive patterns are disposed at the same level as lower ends of the plurality of second conductive patterns.

3. The semiconductor device of claim 1, wherein the plurality of peripheral contact plugs are connected to the plurality of second conductive patterns through recessed lower portions of the plurality of second conductive patterns.

4. The semiconductor device of claim 1, wherein the plurality of first conductive patterns are in contact with the conductive plate, and
- wherein at least one of the plurality of first conductive patterns overlap the gate electrodes in the vertical direction.

5. The semiconductor device of claim 1, wherein the lower surface of the second substrate is in contact with the conductive plate.

6. The semiconductor device of claim 1, wherein the plurality of conductive patterns has at least one pattern, among via hole-type patterns and interconnection line-type patterns.

7. The semiconductor device of claim 1, wherein a width of each of the plurality of the second conductive patterns in a horizontal direction is greater than a width of each of the first conductive patterns in the horizontal direction.

8. The semiconductor device of claim 1, wherein each of the plurality of the conductive patterns includes a conductive layer and a barrier layer on a side surface of the conductive layer.

9. The semiconductor device of claim 8, wherein the second semiconductor structure further includes a peripheral contact via in contact with an upper surface of a second conductive pattern included in the plurality of second conductive patterns and a conductive pad on the peripheral contact via.

10. The semiconductor device of claim 1, wherein the channel structures further include a gate dielectric layer between the channel layer and the gate electrodes and between the channel layer and the conductive plate, and
- wherein the second semiconductor structure further includes a horizontal conductive layer disposed between the conductive plate and the gate electrodes and penetrating through the gate dielectric layer to be in contact with the channel layer.

11. A semiconductor device comprising:
- a first substrate;
- circuit devices disposed on the first substrate;
- a lower interconnection structure electrically connected to the circuit devices;
- a lower bonding structure connected to the lower interconnection structure;
- an upper bonding structure bonded to the lower bonding structure;
- an upper interconnection structure connected to the upper bonding structure;
- a second substrate disposed on the upper interconnection structure;
- a conductive plate disposed below the second substrate;
- gate electrodes disposed between the upper interconnection structure and the conductive plate and stacked to be spaced apart from each other in a vertical direction;
- channel structures penetrating through the gate electrodes and each channel structure including a channel layer;
- a plurality of conductive patterns, respectively disposed in a plurality of openings penetrating through the second substrate; and
- a peripheral contact plug extending in the vertical direction in an external region from the conductive plate and being connected to one of the plurality of conductive patterns,
- wherein a width, in a horizontal direction, of a lower portion of the conductive pattern in contact with the peripheral contact plug is greater than a width, in the horizontal direction, of an upper portion of the conductive pattern.

12. The semiconductor device of claim 11, wherein the lower portion of the conductive pattern is closer to the conductive plate than the upper portion of the conductive pattern.

13. The semiconductor device of claim 11, wherein the plurality of conductive patterns are arranged to be spaced apart from each other throughout an entire region of the second substrate.

14. The semiconductor device of claim 11, wherein the plurality of conductive patterns include a plurality of first conductive patterns in contact with the conductive plate and a plurality of second conductive patterns spaced apart from the conductive plate.

15. The semiconductor device of claim 14, wherein the second substrate includes a first region overlapping the conductive plate in the vertical direction and a second region not overlapping the conductive plate in the vertical direction,
- wherein the plurality of first conductive patterns are disposed in the first region, and
- wherein the plurality of second conductive patterns are disposed in the second region.

16. The semiconductor device of claim 14, wherein lower ends of the plurality of first conductive patterns are disposed at the same level as lower ends of the plurality of second conductive patterns.

17. The semiconductor device of claim 11, further comprising:
- a buffer insulating layer between the plurality of conductive patterns and the second substrate,
- wherein the plurality of conductive patterns are electrically separated from the second substrate by the buffer insulating layer.

18. The semiconductor device of claim 11, wherein the lower bonding structure includes a lower bonding via, connected to the lower interconnection structure, and a lower bonding pad connected to the lower bonding via, wherein the upper bonding structure includes an upper bonding via, connected to the upper interconnection structure, and an upper bonding pad connected to the upper bonding via, and wherein the lower bonding pad and the upper bonding pad are bonded to each other.

19. A data storage system comprising:

a semiconductor storage device including a first semiconductor structure including a first substrate and circuit devices on the first substrate, a second semiconductor structure including a second substrate having a plurality of openings, gate electrodes stacked below the second substrate to be spaced apart from each other, and channel structures penetrating through the gate electrodes, and input/output pads electrically connected to the circuit devices; and a controller electrically connected to the semiconductor storage device through the input/output pads and configured to control the semiconductor storage device, wherein the first semiconductor structure comprises:

a lower interconnection structure electrically connected to the circuit devices; and a lower bonding structure connected to the lower interconnection structure, wherein the second semiconductor structure comprises:

an upper bonding structure bonded to the lower bonding structure;

an upper interconnection structure connected to the upper bonding structure;

a conductive plate between the second substrate and the gate electrodes;

a plurality of conductive patterns, respectively disposed in the plurality of openings of the second substrate;

a buffer insulating layer disposed on side surfaces of the plurality of conductive patterns in the plurality of openings; and a plurality of peripheral contact plugs extending in a vertical direction in an external region from the conductive plate, wherein the plurality of peripheral contact plugs are connected to a portion of the plurality of conductive patterns, respectively, wherein the plurality of conductive patterns are arranged to be spaced apart from each other throughout an entire region of the second substrate, and wherein each of the plurality of conductive patterns has a structure in which a width of a lower portion in a horizontal direction is greater than a width of an upper portion in the horizontal direction.

20. The data storage system of claim 19, wherein the plurality of conductive patterns include a plurality of first conductive patterns in contact with the conductive plate and a plurality of second conductive patterns spaced apart from the conductive plate, wherein the second substrate includes a first region overlapping the conductive plate in the vertical direction and a second region not overlapping the conductive plate in the vertical direction, wherein the plurality of first conductive pattern is disposed in the first region, and wherein the plurality of second conductive patterns are disposed in the second region.

* * * * *